United States Patent
Nishimura et al.

(10) Patent No.: US 12,453,242 B2
(45) Date of Patent: Oct. 21, 2025

(54) ORGANIC DEVICE AND MANUFACTURING METHOD FOR ORGANIC DEVICE

(71) Applicant: Dai Nippon Printing Co., Ltd., Tokyo (JP)

(72) Inventors: Naoki Nishimura, Tokyo (JP); Hiroshi Yano, Tokyo (JP); Yusuke Nakamura, Tokyo (JP); Isao Miyatani, Tokyo (JP); Yoko Nakamura, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 715 days.

(21) Appl. No.: 17/809,579

(22) Filed: Jun. 29, 2022

(65) Prior Publication Data

US 2023/0006168 A1    Jan. 5, 2023

(30) Foreign Application Priority Data

Jul. 1, 2021   (JP) .................................. 2021-110339
Mar. 15, 2022  (JP) .................................. 2022-040695

(51) Int. Cl.
*H10K 59/131*    (2023.01)
*H10K 50/805*    (2023.01)
(Continued)

(52) U.S. Cl.
CPC ......... *H10K 59/121* (2023.02); *H10K 50/805* (2023.02); *H10K 59/131* (2023.02);
(Continued)

(58) Field of Classification Search
CPC .......................... H10K 59/131; H10K 71/166
See application file for complete search history.

(56) References Cited

U.S. PATENT DOCUMENTS

| 2011/0037065 A1 | 2/2011 | Ueno et al. |
| 2011/0163327 A1 | 7/2011 | Ueno et al. |

(Continued)

FOREIGN PATENT DOCUMENTS

| CN | 110729337 A | 1/2020 |
| JP | 2010-272891 A | 12/2010 |

(Continued)

OTHER PUBLICATIONS

Extended European Search Report dated Dec. 5, 2022 (Application No. 22182099.6).

(Continued)

*Primary Examiner* — Mark V Prenty
(74) *Attorney, Agent, or Firm* — BURR PATENT LAW, PLLC

(57) ABSTRACT

An organic device includes an outer edge, a wiring area and a display area that includes a first electrode, an organic layer on the first electrode and a second electrode on the organic layer. The wiring area includes a reference electrode connected to the second electrode and defining a reference potential. The display area includes a first area and a second area bordering the first area. The second area includes a normal area including the second electrode and transmission areas not including the second electrode and arranged in a first direction. The second electrode of the normal area includes connecting portions connected to the second electrode of the first area. The connecting portions include a first connecting portion located on the side of the first side in a second direction. The first connecting portion includes a facing connecting portion located between the transmission areas in the first direction.

16 Claims, 17 Drawing Sheets

(51) Int. Cl.
  *H10K 59/121*  (2023.01)
  *H10K 59/80*   (2023.01)
  *H10K 71/00*   (2023.01)
  *H10K 71/16*   (2023.01)

(52) U.S. Cl.
  CPC ....... *H10K 59/80521* (2023.02); *H10K 71/00* (2023.02); *H10K 71/166* (2023.02)

(56) References Cited

U.S. PATENT DOCUMENTS

| | | |
|---|---|---|
| 2012/0146010 A1 | 6/2012 | Ueno et al. |
| 2014/0008638 A1 | 1/2014 | Otsuki et al. |
| 2020/0381495 A1 | 12/2020 | Jeon et al. |
| 2020/0403043 A1 | 12/2020 | Xin et al. |
| 2020/0411605 A1 | 12/2020 | Moon et al. |
| 2021/0020704 A1 | 1/2021 | Kim |
| 2021/0028248 A1 | 1/2021 | Kim et al. |
| 2022/0020953 A1 | 1/2022 | Huang et al. |
| 2023/0006168 A1* | 1/2023 | Nishimura ........... H10K 71/166 |

FOREIGN PATENT DOCUMENTS

| | | |
|---|---|---|
| JP | 2011-119681 A | 6/2011 |
| JP | WO2012/018082 A1 | 2/2012 |
| JP | 2012-069963 A | 4/2012 |
| JP | 6500082 A | 4/2019 |
| JP | 2021-009355 A | 1/2021 |
| KR | 10-2020-0136549 A | 12/2020 |
| KR | 10-2021-0002283 A | 1/2021 |
| KR | 10-2021-0013458 A | 2/2021 |
| TW | 201939733 A | 10/2019 |
| WO | 2012/132126 A1 | 10/2012 |

OTHER PUBLICATIONS

Taiwanese Office Action (with English translation) dated Mar. 25, 2025 (Application No. 111124507).
Korean Office Action (with English translation) dated Jan. 13, 2025 (Application No. 10-2022-0080565).

* cited by examiner

| | FIRST EXAMPLE | SECOND EXAMPLE | THIRD EXAMPLE | COMPARATIVE EXAMPLE | REFERENCE EXAMPLE |
|---|---|---|---|---|---|
| SECOND OCCUPANCY | 52% | 57% | 26% | 57% | 100% |
| Imax | 100.001nA | 100.001nA | 100.001nA | 100.002nA | 100.000nA |
| Imin | 99.755nA | 99.755nA | 99.723nA | 99.634nA | 99.744nA |
| Idiff | 0.246nA (0.25%) | 0.246nA (0.25%) | 0.278nA (0.28%) | 0.368nA (0.37%) | 0.256nA (0.26%) |

FIG.18

ORGANIC DEVICE AND MANUFACTURING METHOD FOR ORGANIC DEVICE

CROSS REFERENCE TO RELATED APPLICATIONS

This application is based upon and claims the benefit of priority from Japanese Patent Application No. 2021-110339, filed Jul. 1, 2021 and Japanese Patent Application No. 2022-40695, filed Mar. 15, 2022; the entire contents of all of which are incorporated herein by reference.

FIELD

An embodiment of the present disclosure relates to an organic device and a manufacturing method for an organic device.

BACKGROUND

In recent years, in electronic devices, such as smartphones and tablet PCs, a high-resolution display device is desired in the market. The display device has, for example, an element density of 400 ppi or higher or 800 ppi or higher.

Since an organic EL device has a high responsivity or a high contract or both, the organic EL display device has become a focus of attention. A method of depositing the material of elements on a substrate by vapor deposition is known as a method of forming the elements of an organic EL display device. For example, initially, a substrate on which anodes are formed in a pattern corresponding to elements is prepared. Subsequently, an organic layer is formed on each of the anodes by depositing an organic material on the anode via a corresponding one of the through-holes of a mask. After that, a cathode is formed on each of the organic layers by depositing a conductive material on the organic layer via a corresponding one of the through-holes of the mask.

In organic devices, such as organic EL display devices, when a voltage is applied between an anode and a cathode, a current flows from the anode to an organic layer, and the organic layer emits light that constitutes an image. The current having flowed through the organic layer passes through the cathode and flows to a reference electrode that defines a reference potential. Here, depending on the vapor deposition pattern of cathodes, a current resistance value in the cathode of each element can change, and the amount of current flowing through each element can change. As a result, luminance differences occur among the elements of the organic device, and display uniformity can deteriorate.

BRIEF DESCRIPTION OF THE DRAWINGS

FIG. 18 is a table of simulation results of the examples.

DESCRIPTION OF THE PREFERRED EMBODIMENTS

Figure 1:
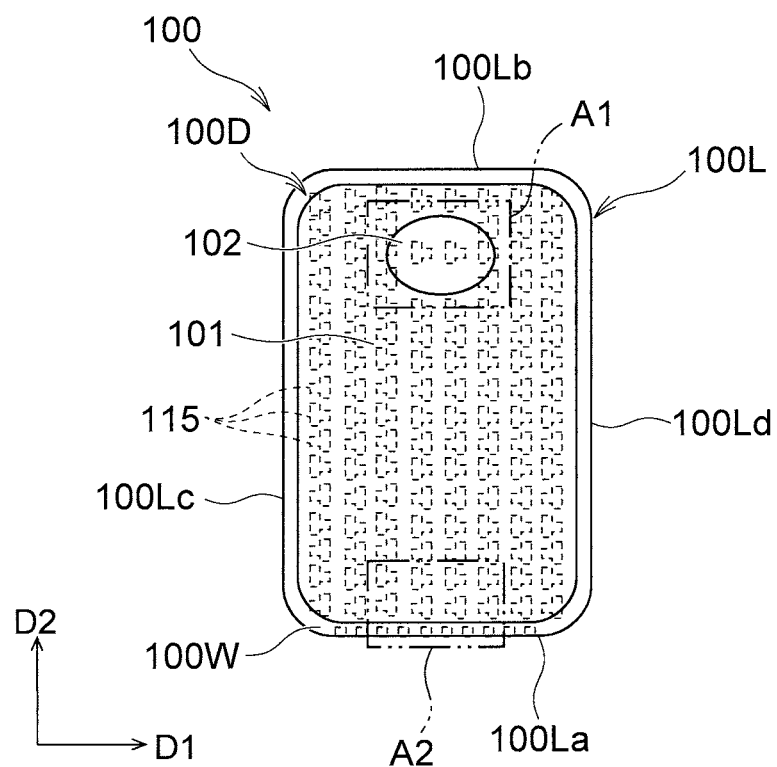
FIG. 1 is a plan view of an example of an organic device according to an embodiment of the present disclosure.

In the specification and the attached drawings, unless otherwise described, terms that mean substances that are the basis of components, such as "substrate", "substrate material", "plate", "sheet", and "film", are not distinguished from one another by the difference in name.

In the specification and the attached drawings, unless otherwise described, terms, such as "parallel" and "orthogonal", values of length and angle, and the like that determine shapes, geometrical conditions and the degrees of them are not limited to strict meanings and are interpreted by including the range of degrees to which similar functions may be expected.

In the specification and the attached drawings, unless otherwise described, when a component of a member, an area, or the like is "on" and "under", "upper side" and "lower side", or "upward" and "downward" of another component of another member, another area, or the like, it includes a case where a component is directly in contact with another component. Furthermore, it also includes a case where further another component is included between a component and another component, that is, a component and another component are indirectly in contact with each other. Unless otherwise described, words "up", "upper side", and "upward", or "down", "lower side", and "downward" may be inverted upside down.

In the specification and the attached drawings, unless otherwise described, the same or similar reference signs denote the same portions or portions having similar functions, and the repeated description can be omitted. The scale ratio of the drawings can be different from the actual ratio for the sake of convenience of illustration, and a portion of components can be omitted from the drawings.

In the specification and the attached drawings, unless otherwise described, an embodiment may be combined with another embodiment or a modification without any contradiction. Alternatively, other embodiments or another embodiment and a modification may also be combined with each other without any contradiction. Alternatively, modifications may also be combined with each other without any contradiction.

In the specification and the attached drawings, unless otherwise described, when a plurality of steps will be described for a method, such as a manufacturing method, another undisclosed step may be performed between the disclosed steps. The order of disclosed steps may be selected without any contradiction.

In the specification and the attached drawings, unless otherwise described, the numeric range expressed by "X" to "Y" includes numeric values assigned to "X" and "Y". For example, a numeric range defined by the expression "34 to 38 percent by mass" is equivalent to a numeric range defined by the expression "higher than or equal to 34 percent by mass and lower than or equal to 38 percent by mass".

According to a first aspect of the present disclosure, an organic device includes:
   an outer edge including a first side and a second side extending in a first direction and facing in a second direction orthogonal to the first direction and a third side and a fourth side extending in a direction from the first side toward the second side;
   a wiring area expanding along the first side; and
   a display area bordering the wiring area, wherein
   the display area includes a first electrode an organic layer disposed on the first electrode, and a second electrode disposed on the organic layers,
   the wiring area includes a reference electrode electrically connected to the second electrode and defining a reference potential,
   the display area includes a first display area and a second display area bordering the first display area,
   the second display area includes a normal area including the second electrode and transmission areas not including the second electrode and arranged in the first direction,
   the second electrode of the normal area includes a plurality of connecting portions connected to the second electrode of the first display area,
   the plurality of connecting portions includes a first connecting portion located on the side of the first side in the second direction, and
   the first connecting portion includes a facing connecting portion located between the transmission areas in the first direction.

According to a second aspect of the present disclosure, in the organic device according to the above-described first aspect,
   the plurality of connecting portions may include a second connecting portion located on the side of the second side in the second direction.

According to a third aspect of the present disclosure, in the organic device according to the above-described second aspect,
   the normal area may include a second direction part in which the second electrode extends from the second connecting portion to the first connecting portion in the second direction, and
   the facing connecting portion may be located at an end of the second direction part on the side of the first side in the second direction.

According to a fourth aspect of the present disclosure, in the organic device according to the above-described third aspect,
   the transmission area may extend from an end bordering the first display area on the side of the second side in the second direction to an end bordering the first display area on the side of the first side in the second direction.

According to a fifth aspect of the present disclosure, in the organic device according to the above-described third aspect,
   the normal area may include a first direction part in which the second electrode extends in the first direction so as to connect the two second direction parts adjacent to each other in the first direction.

According to a sixth aspect of the present disclosure, in the organic device according to any one of the above-described first aspect to the above-described fifth aspect,
   the normal area may include an area in which the second electrode and the organic layer do not overlap in plan view.

According to a seventh aspect of the present disclosure, in the organic device according to any one of the above-described first aspect to the above-described sixth aspect,
   the transmission area may include an area in which a substrate of the organic device and the organic layer do not overlap in plan view.

According to an eighth aspect of the present disclosure, in the organic device according to any one of the above-described first aspect to the above-described seventh aspect,
   the first connecting portion may include the two or more facing connecting portions.

According to a ninth aspect of the present disclosure, in the organic device according to any one of the above-described first aspect to the above-described eighth aspect,
   the size of the first connecting portion in the first direction may be greater than or equal to 5 µm and less than or equal to 500 µm.

According to a tenth aspect of the present disclosure, in the organic device according to any one of the above-described first aspect to the above-described ninth aspect,
   the first connecting portions may be arranged in the first direction with a gap greater than or equal to 10 µm and less than or equal to 550 µm.

According to an eleventh aspect of the present disclosure, in the organic device according to any one of the above-described first aspect to the above-described tenth aspect,
   the second electrode of the normal area may include a first layer and a second layer that partially overlaps the first layer in plan view.

According to a twelfth aspect of the present disclosure, in the organic device according to the above-described eleventh aspect,
   the second electrode of the normal area may include a third layer that partially overlaps the first layer or the second layer in plan view.

According to a thirteenth aspect of the present disclosure, in the organic device according to any one of the above-described first aspect to the above-described twelfth aspect,
   the occupancy of the second electrode in the second display area may be higher than or equal to 40% and lower than or equal to 95%.

According to a fourteenth aspect of the present disclosure, in the organic device according to any one of the above-described first aspect to the above-described thirteenth aspect,
   the first electrode may contain a metal oxide, and
   the second electrode may contain a metal.

According to a fifteenth aspect of the present disclosure, a manufacturing method for the organic device according to any one of the above-described first aspect to the above-described fourteenth aspect includes a second electrode forming step of forming the second electrode on the organic layer provided on the first electrode, wherein the second electrode includes a first layer and a second layer that partially overlaps the first layer in plan view, and the second electrode forming step includes a step of forming the first layer by vapor deposition using a first mask, and a step of forming the second layer by vapor deposition using a second mask.

According to a sixteenth aspect of the present disclosure, in the manufacturing method for the organic device according to the above-described fifteenth aspect, the second electrode may include a third layer that partially overlaps the first layer or the second layer in plan view, and the second electrode forming step may include a step of forming the third layer by vapor deposition using a third mask.

Hereinafter, an embodiment of the present disclosure will be described in detail with reference to the attached drawings. Embodiments described below are examples of the embodiment of the present disclosure, and the present disclosure should not be interpreted limitedly to only these embodiments.

Hereinafter, an organic device 100 according to the present embodiment will be described. FIG. 1 is a plan view of an example of the organic device 100 when viewed in a direction normal to the substrate of the organic device 100. In the following description, a view in a direction normal to the surface of a substance that is a basis for the substrate or the like is also referred to as plan view.

As shown in FIG. 1, the organic device 100 has a substantially rectangular planar shape. The organic device 100 has an outer edge 100L including a first side 100La and a second side 100Lb extending in a first direction D1 (a right and left direction in FIG. 1) and a third side 100Lc and a fourth side 100Ld extending in a second direction D2 (an up and down direction in FIG. 1) orthogonal to the first direction D1 in plan view. The first side 100La and the second side 100Lb face each other in the second direction D2. The first side 100La is located on one side (lower side in FIG. 1) in the second direction D2. The second side 100Lb is located on the other side (upper side in FIG. 1) in the second direction D2. The third side 100Lc and the fourth side 100Ld extend in a direction from the first side 100La toward the second side 100Lb. The third side 100Lc and the fourth side 100Ld face each other in the first direction D1. The third side 100Lc is located on one side (left side in FIG. 1) in the first direction D1. The fourth side 100Ld is located on the other side (right side in FIG. 1) in the first direction D1.

As shown in FIG. 1, the organic device 100 has a wiring area 100W and a display area 100D in plan view. The wiring area 100W expands along the first side 100La. As shown in FIG. 1, the wiring area 100W may be located on one side (lower side in FIG. 1) of the display area 100D in the second direction D2. The display area 100D borders the wiring area 100W. As shown in FIG. 1, the display area 100D may border the wiring area 100W in the second direction D2. The display area 100D may be located on the other side (upper side in FIG. 1) of the wiring area 100W in the second direction D2. The display area 100D may have a greater area than the wiring area 100W.

The display area 100D includes a plurality of elements 115 arranged in the in-plane direction of the substrate. The elements 115 are, for example, pixels. The display area 100D includes a first display area 101 and a second display area 102 in plan view. The second display area 102 borders the first display area 101. The second display area 102 may have a smaller area than the first display area 101. As shown in FIG. 1, the second display area 102 may be surrounded by the first display area 101. As shown in FIG. 1, the second display area 102 may have a circular or elliptical outline. Although not shown in the drawing, part of the outer edge of the second display area 102 may overlap part of the outer edge of the first display area 101. Although not shown in the drawing, the second display area 102 may have a rectangular outline. In this case, for example, the outer edge of the second display area 102 on the side of the second side 100Lb may be located along the same straight line as the outer edge of the first display area 101 on the side of the second side 100Lb.

Figure 2:
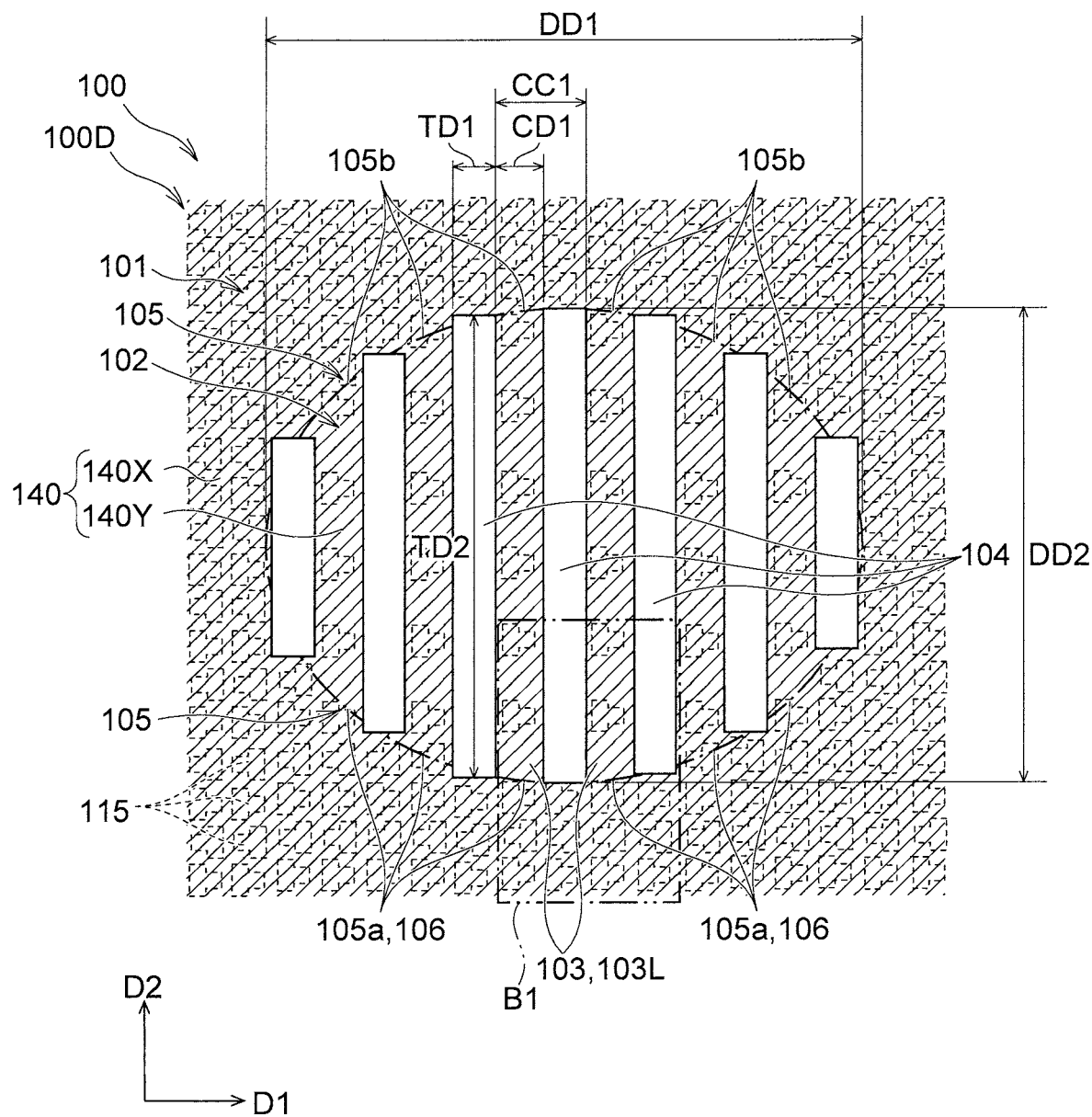
FIG. 2 is an enlarged plan view of the area surrounded by the alternate long and two-short dashed line and indicated by the reference sign A1 in the organic device shown in FIG. 1.

FIG. 2 is an enlarged plan view of the area surrounded by the alternate long and two-short dashed line and indicated by the reference sign A1 in the organic device 100 shown in FIG. 1. In the first display area 101, the elements 115 may be arranged in two different directions. As shown in FIGS. 1 and 2, the two or more elements 115 of the first display area 101 may be arranged in the first direction D1. In addition, the two or more elements 115 of the first display area 101 may be arranged in the second direction D2.

As shown in FIG. 2, the display area 100D includes a second electrode 140. The second electrode 140 is disposed on organic layers 130 (described later). The second electrode 140 may be electrically connected to the organic layers 130. The second electrode 140 located in the first display area 101 is also referred to as second electrode 140X. The second electrode 140 located in the second display area 102 is also referred to as second electrode 140Y.

The second electrode 140X has a first occupancy. The first occupancy is calculated by dividing the total area of the second electrode 140X located in the first display area 101 by the area of the first display area 101. The second electrode 140Y has a second occupancy. The second occupancy is calculated by dividing the total area of the second electrode 140Y located in the second display area 102 by the area of the second display area 102. The second occupancy may be lower than the first occupancy. For example, as shown in FIG. 2, the second display area 102 may include normal areas 103 and transmission areas 104. Each of the normal areas 103 is an area including the second electrode 140Y. Each of the transmission areas 104 is an area not including the second electrode 140Y.

The second occupancy, for example, may be higher than or equal to 20%, may be higher than or equal to 40%, or may be higher than or equal to 50%. The second occupancy, for example, may be lower than or equal to 60%, may be lower than or equal to 80%, or may be lower than or equal to 95%. The range of the second occupancy may be determined by a first group consisting of 20%, 40%, and 50% and/or a second group consisting of 60%, 80%, and 95%. The range of the second occupancy may be determined by a combination of any one of the values in the first group and any one of the values in the second group. The range of the second occupancy may be determined by a combination of any two of the values in the first group. The range of the second occupancy may be determined by a combination of any two of the values in the second group. For example, the range of the second occupancy may be higher than or equal to 20% and lower than or equal to 95%, may be higher than or equal to 20% and lower than or equal to 80%, may be higher than or equal to 20% and lower than or equal to 60%, may be higher than or equal to 20% and lower than or equal to 50%, may be higher than or equal to 20% and lower than or equal to 40%, may be higher than or equal to 40% and lower than or equal to 95%, may be higher than or equal to 40% and lower than or equal to 80%, may be higher than or equal to 40% and lower than or equal to 60%, may be higher than or equal to 40% and lower than or equal to 50%, may be higher than or equal to 50% and lower than or equal to 95%, may be higher than or equal to 50% and lower than or equal to 80%, may be higher than or equal to 50% and lower than or equal to 60%, may be higher than or equal to 60% and lower than or equal to 95%, may be higher than or equal to 60% and lower than or equal to 80%, or may be higher than or equal to 80% and lower than or equal to 95%.

The ratio of the second occupancy to the first occupancy, for example, may be greater than or equal to 0.2, may be greater than or equal to 0.4, or may be greater than or equal to 0.5. The ratio of the second occupancy to the first occupancy, for example, may be less than or equal to 0.6, may be less than or equal to 0.8, or may be less than or equal to 0.95. The range of the ratio of the second occupancy to the first occupancy may be determined by a first group consisting of 0.2, 0.4, and 0.5, and/or a second group consisting of 0.6, 0.8, and 0.95. The range of the ratio of the second occupancy to the first occupancy may be determined by a combination of any one of the values in the first group and any one of the values in the second group. The range of the ratio of the second occupancy to the first occupancy may be determined by a combination of any two of the values in the first group. The range of the ratio of the second occupancy to the first occupancy may be determined by a combination of any two of the values in the second group. For example, the range of the ratio of the second occupancy to the first occupancy may be greater than or equal to 0.2 and less than or equal to 0.95, may be greater than or equal to 0.2 and less than or equal to 0.8, may be greater than or equal to 0.2 and less than or equal to 0.6, may be greater than or equal to 0.2 and less than or equal to 0.5, may be greater than or equal to 0.2 and less than or equal to 0.4, may be greater than or equal to 0.4 and less than or equal to 0.95, may be greater than or equal to 0.4 and less than or equal to 0.8, may be greater than or equal to 0.4 and less than or equal to 0.6, may be greater than or equal to 0.4 and less than or equal to 0.5, may be greater than or equal to 0.5 and less than or equal to 0.95, may be greater than or equal to 0.5 and less than or equal to 0.8, may be greater than or equal to 0.5 and less than or equal to 0.6, may be greater than or equal to 0.6 and less than or equal to 0.95, may be greater than or equal to 0.6 and less than or equal to 0.8, or may be greater than or equal to 0.8 and less than or equal to 0.95.

The transmittance of the normal areas 103 is also referred to as first transmittance TR1. The transmittance of the transmission areas 104 is also referred to as second transmittance TR2. Since each of the transmission areas 104 does not include the second electrode 140Y, the second transmittance TR2 is higher than the first transmittance TR1. Therefore, in the second display area 102 that includes the transmission areas 104, light having reached the organic device 100 is able to pass through the transmission areas 104 and reach an optical component or the like on the back side of the substrate. The optical component is a component of, for example, a camera or the like that implements a function by detecting light. Since the second display area 102 includes the normal areas 103, when the elements 115 are pixels, an image is able to be displayed in the second display area 102. In this way, the second display area 102 is able to detect light and display an image. Examples of the function of the second display area 102, implemented by detecting light, include sensors, such as a camera, a fingerprint sensor and a face recognition sensor. As the second transmittance TR2 of the transmission areas 104 of the second display area 102 increases and the second occupancy decreases, the amount of light received by the sensor is able to be increased.

When either the size of the normal area 103 in the first direction D1 or the second direction D2 or the size of the transmission area 104 in the first direction D1 or the second direction D2 is less than or equal to 1 mm, the first transmittance TR1 and the second transmittance TR2 are able to be measured by using a microspectrophotometer. Any one of OSP-SP200 made by Olympus Corporation and LCF series made by Otsuka Electronics Co., Ltd. can be used as the microspectrophotometer. Any of the microspectrophotometers is capable of measuring a transmittance in a visible range greater than or equal to 380 nm and less than or equal to 780 nm. Any one of quartz, borosilicate glass for TFT liquid crystal and non-alkali glass for TFT liquid crystal is used as a reference. Measurement results at 550 nm are able to be used as the first transmittance TR1 and the second transmittance TR2.

When both the size of the normal area 103 in the first direction D1 and the second direction D2 and the size of the transmission area 104 in the first direction D1 and the second direction D2 are greater than 1 mm, the first transmittance TR1 and the second transmittance TR2 are able to be measured by using a spectrophotometer. Any one of ultraviolet and visible spectrophotometers UV-2600i and UV-3600i Plus made by Shimadzu Corporation can be used as the spectrophotometer. When a micro beam lens unit is attached to the spectrophotometer, the transmittance of an area with a size of up to 1 mm is able to be measured. Atmosphere is able to be used as a reference. Measurement results at 550 nm are able to be used as the first transmittance TR1 and the second transmittance TR2.

TR2/TR1 that is the ratio of the second transmittance TR2 to the first transmittance TR1, for example, may be greater than or equal to 1.2, may be greater than or equal to 1.5, or may be greater than or equal to 1.8. TR2/TR1, for example, may be less than or equal to 2, may be less than or equal to 3, or may be less than or equal to 4. The range of TR2/TR1 may be determined by a first group consisting of 1.2, 1.5, and 1.8 and/or a second group consisting of 2, 3, and 4. The range of TR2/TR1 may be determined by a combination of any one of the values in the first group and any one of the values in the second group. The range of TR2/TR1 may be determined by a combination of any two of the values in the first group. The range of TR2/TR1 may be determined by a combination of any two of the values in the second group. For example, the range of TR2/TR1 may be greater than or equal to 1.2 and less than or equal to 4, may be greater than or equal to 1.2 and less than or equal to 3, may be greater than or equal to 1.2 and less than or equal to 2, may be greater than or equal to 1.2 and less than or equal to 1.8, may be greater than or equal to 1.2 and less than or equal to 1.5, may be greater than or equal to 1.5 and less than or equal to 4, may be greater than or equal to 1.5 and less than or equal to 3, may be greater than or equal to 1.5 and less than or equal to 2, may be greater than or equal to 1.5 and less than or equal to 1.8, may be greater than or equal to 1.8 and less than or equal to 4, may be greater than or equal to 1.8 and less than or equal to 3, may be greater than or equal to 1.8 and less than or equal to 2, may be greater than or equal to 2 and less than or equal to 4, may be greater than or equal to 2 and less than or equal to 3, or may be greater than or equal to 3 and less than or equal to 4.

As shown in FIG. 2, the transmission areas 104 are arranged in the first direction D1. Each transmission area 104 may be located between the normal areas 103 in the first direction D1. In other words, the normal area 103 and the transmission area 104 may be alternately arranged in the first direction D1.

Both ends of each transmission area 104 in the second direction D2 may border the first display area 101. Each transmission area 104 may extend from an end bordering the first display area 101 on the side of the second side 100Lb (upper side in FIG. 2) in the second direction D2 to an end bordering the first display area 101 on the side of the first side 100La (lower side in FIG. 2) in the second direction D2.

As shown in FIG. 2, each transmission area 104 has a first transmission size TD1 in the first direction D1 and a second transmission size TD2 in the second direction D2.

The second transmission size TD2 may be greater than the first transmission size TD1. TD2/TD1 that is the ratio of the second transmission size TD2 to the first transmission size TD1, for example, may be greater than or equal to 2, may be greater than or equal to 5, may be greater than or equal to 10, or may be greater than or equal to 20. TD2/TD1, for example, may be less than or equal to 50, may be less than or equal to 100, may be less than or equal to 200, or may be less than or equal to 500. The range of TD2/TD1 may be determined by a first group consisting of 2, 5, 10, and 20 and/or a second group consisting of 50, 100, 200, and 500. The range of TD2/TD1 may be determined by a combination of any one of the values in the first group and any one of the values in the second group. The range of TD2/TD1 may be determined by a combination of any two of the values in the first group. The range of TD2/TD1 may be determined by a combination of any two of the values in the second group. The range of TD2/TD1, for example, may be greater than or equal to 2 and less than or equal to 500, may be greater than or equal to 2 and less than or equal to 200, may be greater than or equal to 2 and less than or equal to 100, may be greater than or equal to 2 and less than or equal to 50, may be greater than or equal to 2 and less than or equal to 20, may be greater than or equal to 2 and less than or equal to 10, may be greater than or equal to 2 and less than or equal to 5, may be greater than or equal to 5 and less than or equal to 500, may be greater than or equal to 5 and less than or equal to 200, may be greater than or equal to 5 and less than or equal to 100, may be greater than or equal to 5 and less than or equal to 50, may be greater than or equal to 5 and less than or equal to 20, may be greater than or equal to 5 and less than or equal to 10, may be greater than or equal to 10 and less than or equal to 500, may be greater than or equal to 10 and less than or equal to 200, may be greater than or equal to 10 and less than or equal to 100, may be greater than or equal to 10 and less than or equal to 50, may be greater than or equal to 10 and less than or equal to 20, may be greater than or equal to 20 and less than or equal to 500, may be greater than or equal to 20 and less than or equal to 200, may be greater than or equal to 20 and less than or equal to 100, may be greater than or equal to 20 and less than or equal to 50, may be greater than or equal to 50 and less than or equal to 500, may be greater than or equal to 50 and less than or equal to 200, may be greater than or equal to 50 and less than or equal to 100, may be greater than or equal to 100 and less than or equal to 500, may be greater than or equal to 100 and less than or equal to 200, or may be greater than or equal to 200 and less than or equal to 500.

The first transmission size TD1 of each transmission area 104, for example, may be greater than or equal to 5 µm, may be greater than or equal to 20 µm, or may be greater than or equal to 100 µm. The first transmission size TD1, for example, may be less than or equal to 300 µm, may be less than or equal to 350 µm, or may be less than or equal to 550 µm. The range of the first transmission size TD1 of each transmission area 104 may be determined by a first group consisting of 5 µm, 20 µm, and 100 µm and/or a second group consisting of 300 µm, 350 µm, and 550 µm. The range of the first transmission size TD1 of each transmission area 104 may be determined by a combination of any one of the values in the first group and any one of the values in the second group. The range of the first transmission size TD1 of each transmission area 104 may be determined by a combination of any two of the values in the first group. The range of the first transmission size TD1 of each transmission area 104 may be determined by a combination of any two of the values in the second group. The range of the first transmission size TD1 of each transmission area 104, for example, may be greater than or equal to 5 µm and less than or equal to 550 µm, may be greater than or equal to 5 µm and less than or equal to 350 µm, may be greater than or equal to 5 µm and less than or equal to 300 µm, may be greater than or equal to 5 µm and less than or equal to 100 µm, may be greater than or equal to 5 µm and less than or equal to 20 µm, may be greater than or equal to 20 µm and less than or equal to 550 µm, may be greater than or equal to 20 µm and less than or equal to 350 µm, may be greater than or equal to 20 µm and less than or equal to 300 µm, may be greater than or equal to 20 µm and less than or equal to 100 µm, may be greater than or equal to 100 µm and less than or equal to 550 µm, may be greater than or equal to 100 µm and less than or equal to 350 µm, may be greater than or equal to 100 µm and less than or equal to 300 µm, may be greater than or equal to 300 µm and less than or equal to 550 µm, may be greater than or equal to 300 µm and less than or equal to 350 µm, or may be greater than or equal to 350 µm and less than or equal to 550 µm.

As shown in FIG. 2, the second electrode 140Y of each normal area 103 includes a plurality of connecting portions 105 connected to the second electrode 140X of the first display area 101. With the connecting portions 105, the second electrode 140Y of each normal area 103 and the second electrode 140X of the first display area 101 are electrically connected. Each connecting portion 105 may be made up of the second electrode 140Y located at a boundary between the normal area 103 and the first display area 101, of the second electrode 140Y of the normal area 103.

The plurality of connecting portions 105 includes a first connecting portion 105a located on the side of the first side 100La (lower side in FIG. 2) in the second direction D2 and a second connecting portion 105b located on the side of the second side 100Lb (upper side in FIG. 2) in the second direction D2. The second connecting portion 105b is located on the side opposite to the first connecting portion 105a in the second direction D2. As shown in FIG. 2, of the plurality of connecting portions 105, the connecting portion disposed on the lower half side of the second display area 102 may be the first connecting portion 105a, and the connecting portion disposed on the upper half side of the second display area 102 may be the second connecting portion 105b. Although not shown in the drawing, when the second display area 102 has a rectangular outline and the outer edge of the second display area 102 on the side of the second side 100Lb is located along the same straight line as the outer edge of the first display area 101 on the side of the second side 100Lb, the second electrode 140Y does not need to include the second connecting portion 105b.

The first connecting portion 105a includes a facing connecting portion 106. The facing connecting portion 106 is located between the transmission areas 104 in the first direction D1. Therefore, the facing connecting portion 106 faces a reference electrode 150 (described later). In other words, of the first connecting portions 105a, the connecting portions facing the reference electrode 150 are the facing connecting portions 106. Here, the word "facing" is not used only in the strict meaning that horizontal planes face each other so as to be parallel to an object but used in the meaning that the horizontal planes substantially face an object. The facing connecting portion 106 is defined as a connecting portion located between the transmission areas 104 in the first direction D1, of the first connecting portions 105a. The first connecting portions 105a may include two or more facing connecting portions 106. As shown in FIG. 2, all the first connecting portions 105a may be the facing connecting portions 106, or some of the first connecting portions 105a may be the facing connecting portions 106.

As shown in FIG. 2, each first connecting portion 105a has a connecting size CD1 in the first direction D1. The first connecting portions 105a may be arranged periodically with a connection pitch CC1 in the first direction D1.

The connecting size CD1 of each first connecting portion 105a, for example, may be greater than or equal to 5 μm, may be greater than or equal to 20 μm, or may be greater than or equal to 100 μm. The connecting size CD1 of each first connecting portion 105a, for example, may be less than or equal to 250 μm, may be less than or equal to 300 μm, or may be less than or equal to 500 μm. The range of the connecting size CD1 of each first connecting portion 105a may be determined by a first group consisting of 5 μm, 20 μm, and 100 μm and/or a second group consisting of 250 μm, 300 μm, and 500 μm. The range of the connecting size CD1 of each first connecting portion 105a may be determined by a combination of any one of the values in the first group and any one of the values in the second group. The range of the connecting size CD1 of each first connecting portion 105a may be determined by a combination of any two of the values in the first group. The range of the connecting size CD1 of each first connecting portion 105a may be determined by a combination of any two of the values in the second group. The range of the connecting size CD1 of each first connecting portion 105a, for example, may be greater than or equal to 5 μm and less than or equal to 500 μm, may be greater than or equal to 5 μm and less than or equal to 300 μm, may be greater than or equal to 5 μm and less than or equal to 250 μm, may be greater than or equal to 5 μm and less than or equal to 100 μm, may be greater than or equal to 5 μm and less than or equal to 20 μm, may be greater than or equal to 20 μm and less than or equal to 500 μm, may be greater than or equal to 20 μm and less than or equal to 300 μm, may be greater than or equal to 20 μm and less than or equal to 250 μm, may be greater than or equal to 20 μm and less than or equal to 100 μm, may be greater than or equal to 100 μm and less than or equal to 500 μm, may be greater than or equal to 100 μm and less than or equal to 300 μm, may be greater than or equal to 100 μm and less than or equal to 250 μm, may be greater than or equal to 250 μm and less than or equal to 500 μm, may be greater than or equal to 250 μm and less than or equal to 300 μm, or may be greater than or equal to 300 μm and less than or equal to 500 μm.

The connection pitch CC1 of the first connecting portions 105a, for example, may be greater than or equal to 10 μm, may be greater than or equal to 30 μm, or may be greater than or equal to 150 μm. The connection pitch CC1 of the first connecting portions 105a, for example, may be less than or equal to 300 μm, may be less than or equal to 350 μm, or may be less than or equal to 550 μm. The range of the connection pitch CC1 of the first connecting portions 105a may be determined by a first group consisting of 10 μm, 30 μm, and 150 μm and/or a second group consisting of 300 μm, 350 μm, and 550 μm. The range of the connection pitch CC1 of the first connecting portions 105a may be determined by a combination of any one of the values in the first group and any one of the values in the second group. The range of the connection pitch CC1 of the first connecting portions 105a may be determined by a combination of any two of the values in the first group. The range of the connection pitch CC1 of the first connecting portions 105a may be determined by a combination of any two of the values in the second group. The range of the connection pitch CC1 of the first connecting portions 105a, for example, may be greater than or equal to 10 μm and less than or equal to 550 μm, may be greater than or equal to 10 μm and less than or equal to 350 μm, may be greater than or equal to 10 μm and less than or equal to 300 μm, may be greater than or equal to 10 μm and less than or equal to 150 μm, may be greater than or equal to 10 μm and less than or equal to 30 μm, may be greater than or equal to 30 μm and less than or equal to 550 μm, may be greater than or equal to 30 μm and less than or equal to 350 μm, may be greater than or equal to 30 μm and less than or equal to 300 μm, may be greater than or equal to 30 μm and less than or equal to 150 μm, may be greater than or equal to 150 μm and less than or equal to 550 μm, may be greater than or equal to 150 μm and less than or equal to 350 μm, may be greater than or equal to 150 μm and less than or equal to 300 μm, may be greater than or equal to 300 μm and less than or equal to 550 μm, may be greater than or equal to 300 μm and less than or equal to 350 μm, or may be greater than or equal to 350 μm and less than or equal to 550 μm.

The connecting size of each second connecting portion 105b in the first direction D1 may be the same as the connecting size CD1 of each first connecting portion 105a in the first direction D1. The connecting size of each second connecting portion 105b in the first direction D1 may be greater than or less than the connecting size CD1 of each first connecting portion 105a in the first direction D1. The connecting size of each second connecting portion 105b in the first direction D1, for example, may be greater than or equal to 5 μm, may be greater than or equal to 20 μm, or may be greater than or equal to 100 μm. The connecting size of each second connecting portion 105b in the first direction D1, for example, may be less than or equal to 250 μm, may be less than or equal to 300 μm, or may be less than or equal to 500 μm.

The connection pitch of the second connecting portions 105b in the first direction D1 may be the same as the connection pitch CC1 of the first connecting portions 105a in the first direction D1. The connection pitch of the second connecting portions 105b in the first direction D1 may be greater than or less than the connection pitch CC1 of the first connecting portions 105a in the first direction D1. The connection pitch of the second connecting portions 105b in the first direction D1, for example, may be greater than or equal to 10 μm, may be greater than or equal to 30 μm, or may be greater than or equal to 150 μm. The connection pitch of the second connecting portions 105b in the first direction D1, for example, may be less than or equal to 300 µm, may be less than or equal to 350 µm, or may be less than or equal to 550 µm.

As shown in FIG. 2, each of the normal areas 103 may include a second direction part 103L in which the second electrode 140Y extends from the second connecting portion 105b to the first connecting portion 105a in the second direction D2. In other words, the second electrode 140Y included in the second direction part 103L extends from the second connecting portion 105b to the first connecting portion 105a in the second direction D2. In this case, the facing connecting portion 106 is located at an end of the second direction part 103L on the side of the first side 100La (lower side in FIG. 2) in the second direction D2. In other words, the end of the second direction part 103L on the side of the first side 100La in the second direction D2 is the above-described facing connecting portion 106.

The size DD1 of the second display area 102 in the first direction D1, for example, may be greater than or equal to 0.5 mm, may be greater than or equal to 3 mm, or may be greater than or equal to 5 mm. The size DD1 of the second display area 102 in the first direction D1, for example, may be less than or equal to 10 mm, may be less than or equal to 20 mm, or may be less than or equal to 30 mm. The range of the size DD1 of the second display area 102 in the first direction D1 may be determined by a first group consisting of 0.5 mm, 3 mm, and 5 mm and/or a second group consisting of 10 mm, 20 mm, and 30 mm. The range of the size DD1 of the second display area 102 in the first direction D1 may be determined by a combination of any one of the values in the first group and any one of the values in the second group. The range of the size DD1 of the second display area 102 in the first direction D1 may be determined by a combination of any two of the values in the first group. The range of the size DD1 of the second display area 102 in the first direction D1 may be determined by a combination of any two of the values in the second group. The range of the size DD1 of the second display area 102 in the first direction D1, for example, may be greater than or equal to 0.5 mm and less than or equal to 30 mm, may be greater than or equal to 0.5 mm and less than or equal to 20 mm, may be greater than or equal to 0.5 mm and less than or equal to 10 mm, may be greater than or equal to 0.5 mm and less than or equal to 5 mm, may be greater than or equal to 0.5 mm and less than or equal to 3 mm, may be greater than or equal to 3 mm and less than or equal to 30 mm, may be greater than or equal to 3 mm and less than or equal to 20 mm, may be greater than or equal to 3 mm and less than or equal to 10 mm, may be greater than or equal to 3 mm and less than or equal to 5 mm, may be greater than or equal to 5 mm and less than or equal to 30 mm, may be greater than or equal to 5 mm and less than or equal to 20 mm, may be greater than or equal to 5 mm and less than or equal to 10 mm, may be greater than or equal to 10 mm and less than or equal to 30 mm, may be greater than or equal to 10 mm and less than or equal to 20 mm, or may be greater than or equal to 20 mm and less than or equal to 30 mm.

The size DD2 of the second display area 102 in the second direction D2, for example, may be greater than or equal to 0.5 mm, may be greater than or equal to 3 mm, or may be greater than or equal to 5 mm. The size DD2 of the second display area 102 in the second direction D2, for example, may be less than or equal to 10 mm, may be less than or equal to 20 mm, or may be less than or equal to 30 mm. The range of the size DD2 of the second display area 102 in the second direction D2 may be determined by a first group consisting of 0.5 mm, 3 mm, and 5 mm and/or a second group consisting of 10 mm, 20 mm, and 30 mm. The range of the size DD2 of the second display area 102 in the second direction D2 may be determined by a combination of any one of the values in the first group and any one of the values in the second group. The range of the size DD2 of the second display area 102 in the second direction D2 may be determined by a combination of any two of the values in the first group. The range of the size DD2 of the second display area 102 in the second direction D2 may be determined by a combination of any two of the values in the second group. The range of the size DD2 of the second display area 102 in the second direction D2, for example, may be greater than or equal to 0.5 mm and less than or equal to 30 mm, may be greater than or equal to 0.5 mm and less than or equal to 20 mm, may be greater than or equal to 0.5 mm and less than or equal to 10 mm, may be greater than or equal to 0.5 mm and less than or equal to 5 mm, may be greater than or equal to 0.5 mm and less than or equal to 3 mm, may be greater than or equal to 3 mm and less than or equal to 30 mm, may be greater than or equal to 3 mm and less than or equal to 20 mm, may be greater than or equal to 3 mm and less than or equal to 10 mm, may be greater than or equal to 3 mm and less than or equal to 5 mm, may be greater than or equal to 5 mm and less than or equal to 30 mm, may be greater than or equal to 5 mm and less than or equal to 20 mm, may be greater than or equal to 5 mm and less than or equal to 10 mm, may be greater than or equal to 10 mm and less than or equal to 30 mm, may be greater than or equal to 10 mm and less than or equal to 20 mm, or may be greater than or equal to 20 mm and less than or equal to 30 mm.

Figure 3:
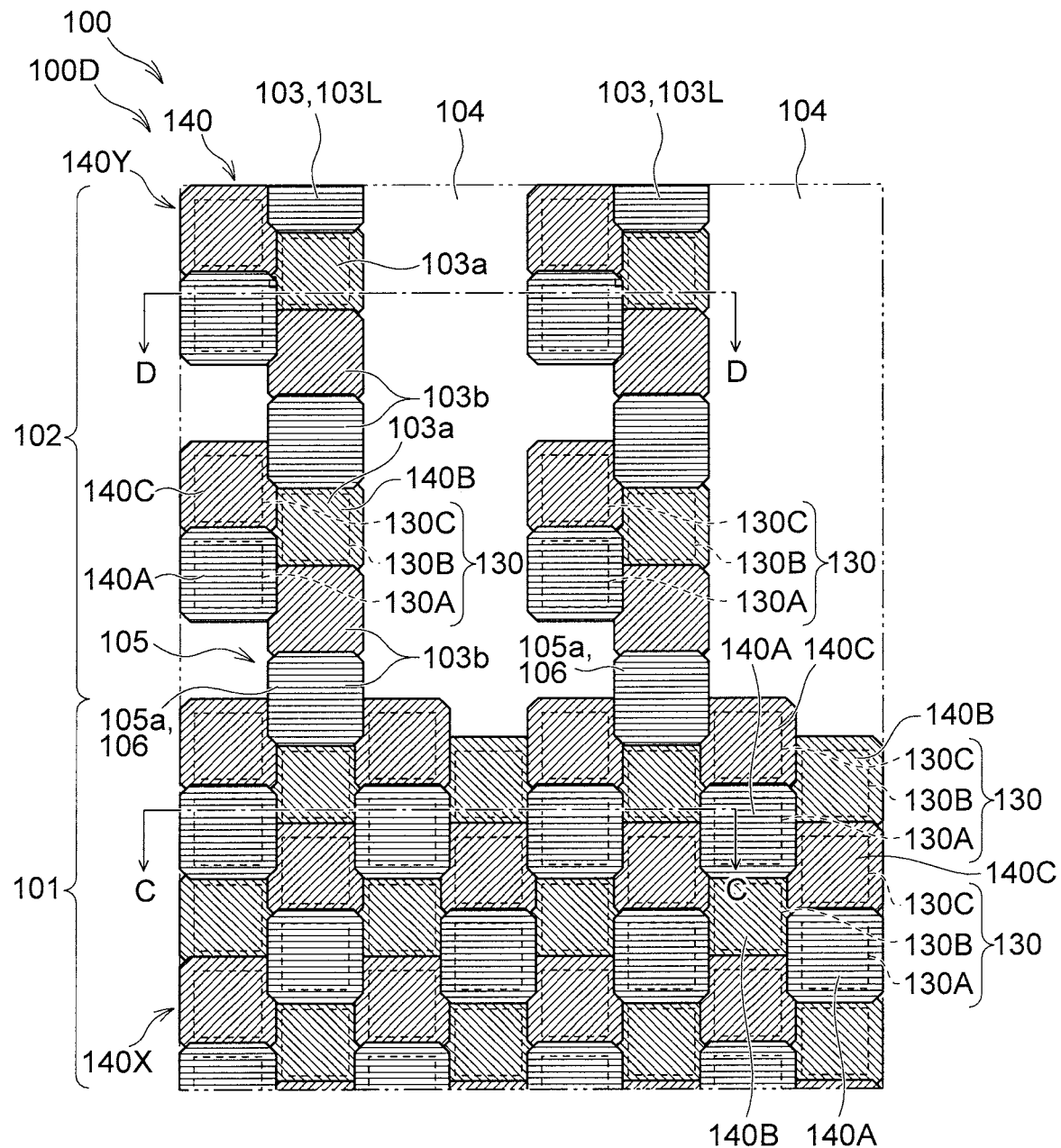
FIG. 3 is an enlarged plan view of the area surrounded by the alternate long and two-short dashed line and indicated by the reference sign B1 in the organic device shown in FIG. 2.
Figure 4:
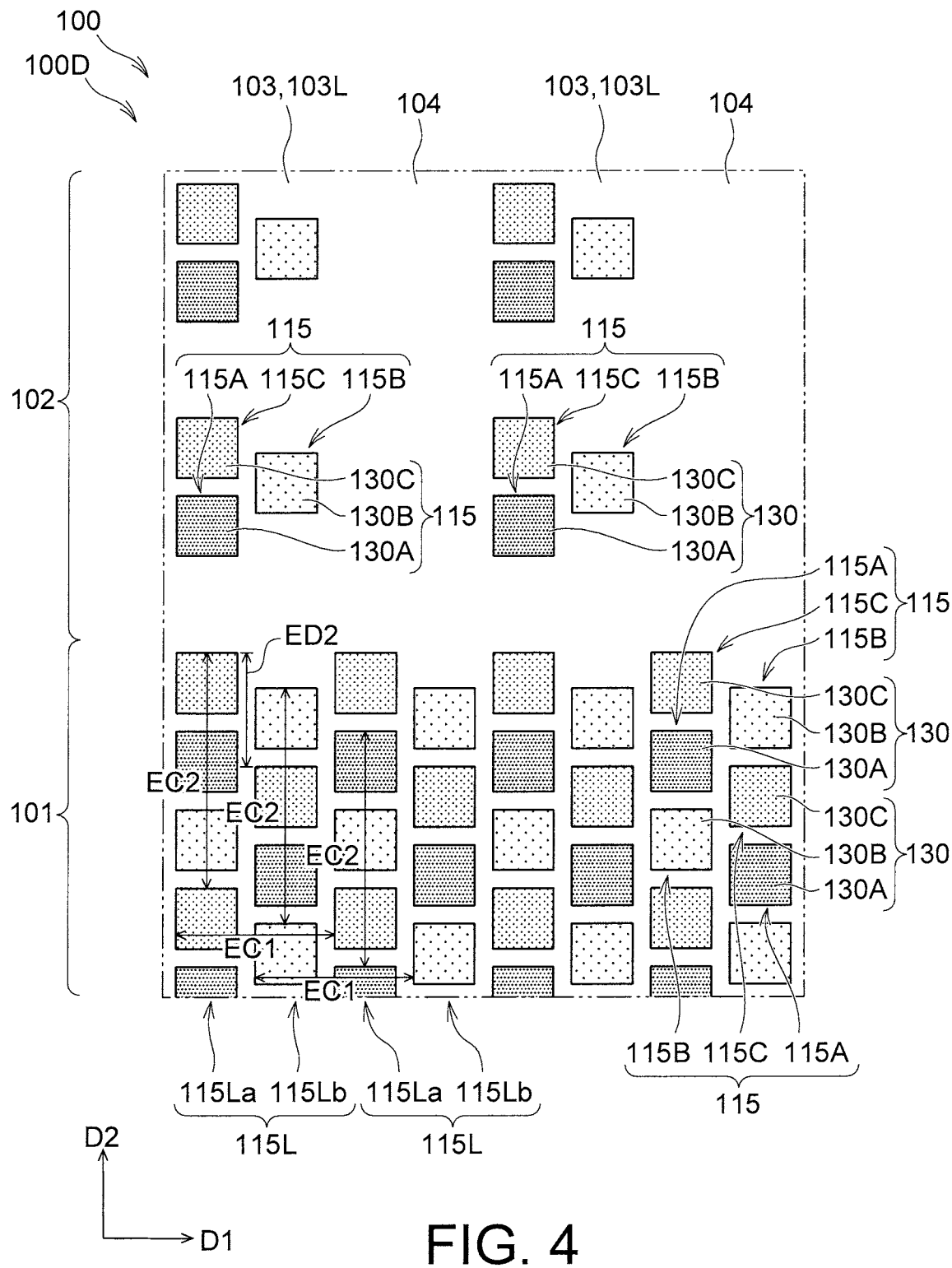
FIG. 4 is a plan view of a state where a second electrode is removed from the organic device shown in FIG. 3.
Figure 5:
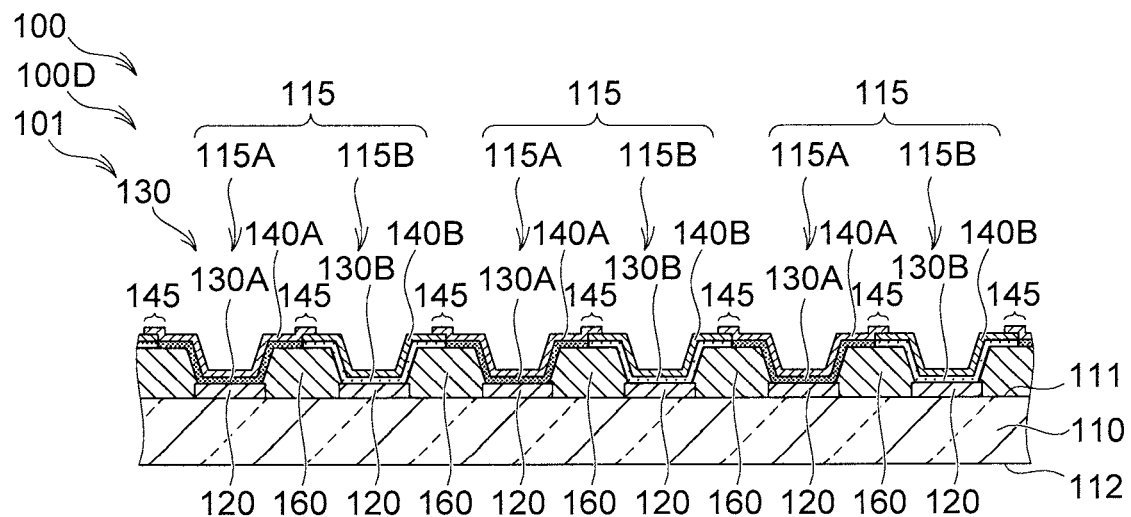
FIG. 5 is a sectional view of the organic device, taken along the line C-C in FIG. 3.

FIG. 3 is an enlarged plan view of the area surrounded by the alternate long and two-short dashed line and indicated by the reference sign B1 in the organic device 100 shown in FIG. 2. FIG. 4 is a plan view of a state where the second electrode 140 is removed from the organic device 100 shown in FIG. 3. FIG. 5 is a sectional view of the first display area 101 of the organic device 100, taken along the line C-C in FIG. 3.

As shown in FIG. 5, the organic device 100 includes a substrate 110 and elements 115 disposed on the substrate 110. More specifically, the display area 100D of the organic device 100 includes the substrate 110 and the elements 115 disposed on the substrate 110. Each of the elements 115 includes a first electrode 120, the organic layer 130 disposed on the first electrode 120 and the second electrode 140 disposed on the organic layer 130.

The organic device 100 may include an insulating layer 160 located between any adjacent two of the first electrodes 120 in plan view. The insulating layer 160 includes, for example, polyimide. The insulating layer 160 may overlap the ends of the first electrodes 120.

The organic device 100 may be an active matrix type. For example, although not shown in the drawing, the organic device 100 may include switches respectively electrically connected to the plurality of elements 115. Each of the switches is, for example, a transistor. Each of the switches is capable of controlling the on/off state of voltage or current to a corresponding one of the elements 115.

The substrate 110 may be a sheet-like member having electrical insulation properties. The substrate 110 preferably has transparency for transmitting light.

When the substrate 110 has a predetermined transparency, the transparency of the substrate 110 may be a transparency to such an extent that the substrate 110 is able to transmit light emitted from the organic layers 130 to display. For example, the transmittance of the substrate 110 in a visible light range may be higher than or equal to 80% and more higher than or equal to 90%. The transmittance of the substrate 110 is able to be measured by a method of testing a total light transmittance of plastic-transparent material, which is in conformity with JIS K7361-1.

The substrate 110 may have flexibility or does not need to have flexibility. The substrate 110 can be selected as needed according to the uses of the organic device 100.

Examples of the material of the substrate 110 include non-flexible rigid materials, such as quartz glass, Pyrex (registered trademark) glass and synthetic quartz plate, and flexible materials, such as resin film, optical resin sheet and thin glass. The substrate material may be a multilayer body with a barrier layer on one side or each side of a resin film.

The thickness of the substrate 110 can be selected as needed according to a material used for the substrate 110, the use of the organic device 100 and the like. The thickness of the substrate 110, for example, may be greater than or equal to 0.005 mm. The thickness of the substrate 110, for example, may be less than or equal to 5 mm.

Each of the elements 115 is configured to implement a function when a voltage is applied between the first electrode 120 and the second electrode 140 and a current flows between the first electrode 120 and the second electrode 140. When, for example, the elements 115 are pixels of an organic EL display device, the elements 115 are capable of emitting light that constitutes an image.

The first electrode 120 includes a material having electrical conductivity. Examples of the first electrode 120 may include a metal, a metal oxide having electrical conductivity and other inorganic materials having electrical conductivity. The first electrode 120 may include a metal oxide having transparency and electrical conductivity, such as indium tin oxide.

A metal, such as Au, Cr, Mo, Ag and Mg, an inorganic oxide, such as indium tin oxide referred to as ITO, indium zinc oxide referred to as IZO, zinc oxide, and indium oxide, or a conductive polymer, such as metal-doped polythiophene, may be used as the material of the first electrode 120. These conductive materials may be used solely or two or more types of these conductive materials may be used in combination. When two or more types are used, layers respectively made of materials may be laminated. Alternatively, an alloy that includes two or more materials may be used. Examples of the alloy include magnesium alloys, such as MgAg.

The organic layer 130 includes an organic material. When the organic layer 130 is energized, the organic layer 130 is capable of exerting a function. Energization means that a voltage is applied to the organic layer 130 and a current flows through the organic layer 130. A light emitting layer that emits light when energized, a layer that varies in transmittance or refractive index of light when energized or the like may be used as the organic layer 130. The organic layer 130 may include an organic semiconductor material.

As shown in FIGS. 4 and 5, the organic layers 130 may include a first organic layer 130A and a second organic layer 130B. As shown in FIG. 4, the organic layers 130 may further include a third organic layer 130C. The first organic layer 130A, the second organic layer 130B and the third organic layer 130C may be, for example, a red light emitting layer, a blue light emitting layer and a green light emitting layer, respectively. In the following description, when the configuration of an organic layer, which is common among the first organic layer 130A, the second organic layer 130B and the third organic layer 130C, is described, the term and the reference sign "organic layer 130" are used.

A multilayer structure that includes the first electrode 120, the first organic layer 130A and the second electrode 140 is also referred to as first element 115A. A multilayer structure that includes the first electrode 120, the second organic layer 130B and the second electrode 140 is also referred to as second element 115B. A multilayer structure that includes the first electrode 120, the third organic layer 130C and the second electrode 140 is also referred to as third element 115C. When the organic device 100 is an organic EL display device, the first element 115A, the second element 115B and the third element 115C each are a sub-pixel.

In the following description, when the configuration of an element, which is common among the first element 115A, the second element 115B and the third element 115C, is described, the term and the reference sign "element 115" are used. In plan view as shown in FIG. 4, the outline of each element 115 may be the outline of the organic layer 130 that overlaps the first electrode 120 and the second electrode 140 in plan view. When the organic device 100 includes the insulating layer 160, the outline of each element 115 may be the outline of the organic layer 130 that overlaps the first electrode 120 and the second electrode 140 but does not overlap the insulating layer 160 in plan view.

Arrangement of each of the first element 115A, the second element 115B and the third element 115C will be described. As shown in FIG. 4, in the display area 100D, each of the first element 115A, the second element 115B and the third element 115C may be arranged in the first direction D1. In addition, each of the first element 115A, the second element 115B and the third element 115C may be arranged in the second direction D2.

As shown in FIG. 4, the display area 100D may include a plurality of element arrays 115L arranged in the first direction D1. The plurality of element arrays 115L may include a first element array 115La and a second element array 115Lb adjacent to each other in the first direction D1. The first element array 115La and the second element array 115Lb may be alternately arranged in the first direction D1. The first element arrays 115La may be arranged periodically with a pitch EC1 in the first direction. The second element arrays 115Lb may be arranged periodically with a pitch EC1 in the first direction.

In the first display area 101, each of the first element array 115La and the second element array 115Lb may include the first element 115A, the second element 115B and the third element 115C, each of which is arranged periodically with a pitch EC2 in the second direction D2. In other words, in each of the first element array 115La and the second element array 115Lb, the first elements 115A may be arranged periodically with the pitch EC2 in the second direction D2, the second elements 115B may be arranged periodically with the pitch EC2 in the second direction D2 and the third elements 115C may be arranged periodically with the pitch EC2 in the second direction D2.

The first element array 115La and the second element array 115Lb may be shifted by a pitch ED2 in the second direction D2. In other words, the first element 115A of the first element array 115La may be located so as to be shifted by the pitch ED2 from the first element 115A of the second element array 115Lb in the second direction D2. The second element 115B of the first element array 115La may be located so as to be shifted by the pitch ED2 from the second element 115B of the second element array 115Lb in the second direction D2. The third element 115C of the first element array 115La may be located so as to be shifted by the pitch ED2 from the third element 115C of the second element array 115Lb in the second direction D2. The pitch ED2 may be half the pitch EC2. Thus, as shown in FIG. 4, the second element 115B of the second element array 115Lb may be located between the first element 115A of the first element array 115La and the third element 115C of the first element array 115La in the second direction D2. One element 115 may be made up of these first element 115A, second element 115B and third element 115C. The second element 115B of the first element array 115La may be located between the first element 115A of the second element array 115Lb and the third element 115C of the second element array 115Lb in the second direction D2. One element 115 may be made up of these first element 115A, second element 115B and third element 115C.

When a voltage is applied between the first electrode 120 and the second electrode 140, a current flows through the organic layer 130 disposed therebetween. When the organic layer 130 is a light emitting layer, light is emitted from the organic layer 130 exits from the second electrode 140 side or the first electrode 120 side.

When the organic layer 130 includes a light emitting layer that emits light when energized, the organic layer 130 may further include a hole injection layer, a hole transport layer, an electron transport layer, an electron injection layer, and the like.

When, for example, the first electrode 120 is an anode, the organic layer 130 may include a hole injection and transport layer between the light emitting layer and the first electrode 120. The hole injection and transport layer may be a hole injection layer that has a hole injection function, may be a hole transport layer that has a hole transport function, or may be a layer having both the hole injection function and the hole transport function. Alternatively, the hole injection and transport layer may be a multilayer body formed by laminating a hole injection layer and a hole transport layer.

When the second electrode 140 is a cathode, the organic layer 130 may have an electron injection and transport layer between the light emitting layer and the second electrode 140. The electron injection and transport layer may be an electron injection layer that has an electron injection function, may be an electron transport layer that has an electron transport function, or may be a layer having both the electron injection function and the electron transport function. Alternatively, the electron injection and transport layer may be a multilayer body formed by laminating an electron injection layer and an electron transport layer.

The light emitting layer includes a luminescent material. The light emitting layer may include an additive that improves leveling properties.

A known material may be used as a luminescent material. For example, luminescent materials, such as dye materials, metal complex materials and polymer materials, may be used. Examples of the dye materials include cyclopentadiene derivatives, tetraphenyl butadiene derivatives, triphenylamine derivatives, oxadiazole derivatives, pyrazoloquinoline derivatives, distyrylbenzene derivatives, distyrylarylene derivatives, silole derivatives, thiophene ring compounds, pyridine ring compounds, perinone derivatives, perylene derivatives, oligothiophene derivatives, an oxadiazole dimer, and a pyrazoline dimer. Metal complexes that have Al, Zn, Be, or the like, or a rare earth metal, such as Tb, Eu, and Dy, as a central metal and that have oxadiazole, thiadiazole, phenylpyridine, phenylbenzimidazole, a quinoline structure, or the like, as a ligand may be used as the metal complex material. Examples of the metal complex material include aluminum quinolinol complexes, benzoquinolinol beryllium complexes, benzoxazole zinc complexes, benzothiazole zinc complexes, azomethyl zinc complexes, porphyrin zinc complexes, and europium complexes. Examples of the polymer materials include poly(p-phenylene vinylene) derivatives, polythiophene derivatives, poly(p-phenylene) derivatives, polysilane derivatives, polyacetylene derivatives, polyvinylcarbazole derivatives, polyfluorene derivatives, polyquinoxaline derivatives, and copolymers of them.

The light emitting layer may contain a dopant for the purpose of, for example, improving the luminous efficiency and varying the emission wavelength. Examples of the dopant include perylene derivatives, coumarin derivatives, rubrene derivatives, quinacridone derivatives, squarylium derivatives, porphyrin derivatives, styryl dyes, tetracene derivatives, pyrazoline derivatives, decacyclene, phenoxazone, quinoxaline derivatives, carbazole derivatives, and fluorene derivatives. Organic metal complexes that have ions of heavy metals, such as platinum and iridium, as a center and that exhibit phosphorescence may be used as the dopant. One dopant may be used solely or two or more dopants may be used.

For example, the materials described at paragraphs 0094 to 0099 in Japanese Unexamined Patent Publication No. 2010-272891 and the materials described at paragraphs 0053 to 0057 in International Publication No. 2012/132126 may also be used as the luminescent material and the dopant.

The thickness of the light emitting layer is not limited as long as the thickness allows to provide a field for recombination between electrons and holes and exert the function of light emission. The thickness, for example, may be greater than or equal to 1 nm and may be less than or equal to 500 nm.

A known material may be used as a hole injection and transport material used for the hole injection and transport layer. Examples of the hole injection and transport material include triazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, oxadiazole derivatives, styrylanthracene derivatives, fluorenone derivatives, hydrazone derivatives, stilbene derivatives, silazane derivatives, polythiophene derivatives, polyaniline derivatives, polypyrrole derivatives, phenylamine derivatives, anthracene derivatives, carbazole derivatives, fluorene derivatives, distyrylbenzene derivatives, polyphenylenevinylene derivatives, porphyrin derivatives, and styrylamine derivatives. Examples of the hole injection and transport material also include spiro compounds, phthalocyanine compounds, and metal oxides. For example, the compounds described in Japanese Unexamined Patent Application Publication No. 2011-119681, International Publication No. 2012/018082, Japanese Unexamined Patent Application Publication No. 2012-069963, and at paragraph 0106 in International Publication No. 2012/132126 may also be used as needed.

When the hole injection and transport layer is a multilayer body formed by laminating a hole injection layer and a hole transport layer, the hole injection layer may contain an additive A, the hole transport layer may contain an additive A, or the hole injection layer and the hole transport layer may contain an additive A. The additive A may be a low-molecular compound or may be a polymeric compound. Specifically, fluorine compounds, ester compounds, hydrocarbon compounds, or the like may be used.

A known material may be used as an electron injection and transport material used for the electron injection and transport layer. Examples of the electron injection and transport material include alkali metals, alkali metal alloys, alkali metal halides, alkaline earth metals, alkaline earth metal halides, alkaline earth metal oxides, alkali metal organic complexes, magnesium halides, magnesium oxides, and aluminum oxides. Examples of the electron injection and transport material include bathocuproine, bathophenanthroline, phenanthroline derivatives, triazole derivatives, oxadiazole derivatives, pyridine derivatives, nitro-substituted fluorene derivatives, anthraquinodimethane derivatives, diphenylquinone derivatives, thiopyran dioxide derivatives, aromatic ring tetracarboxylic anhydrides, such as naphthalene and perylene, carbodiimide, fluorenylidenemethane derivatives, anthraquinodimethane derivatives, anthrone derivatives, quinoxaline derivatives, metal complexes, such as quinolinol complexes, phthalocyanine compounds, and distyrylpyrazine derivatives.

An electron transport organic material may be doped with an alkali metal or an alkaline earth metal to form a metal dope layer, and the metal dope layer may be used as the electron injection and transport layer. Examples of the electron transport organic material include bathocuproine, bathophenanthroline, phenanthroline derivatives, triazole derivatives, oxadiazole derivatives, pyridine derivatives, metal complexes, such as tris(8-quinolinolato) aluminum ($Alq_3$), and polymeric derivatives of them. Li, Cs, Ba, Sr, or the like may be used as a dopant metal.

The second electrode 140 includes a material having electrical conductivity, such as metal. The second electrode 140 is formed on the organic layers 130 by vapor deposition using masks (described later). Examples of the material of the second electrode 140 include platinum, gold, silver, copper, iron, tin, chromium, aluminum, indium, lithium, sodium, potassium, calcium, magnesium and carbon. These materials may be used solely or two or more types of these materials may be used in combination. When two or more types are used, layers respectively made of materials may be laminated. Alternatively, an alloy that includes two or more materials may be used. Examples of the alloy include magnesium alloys, such as MgAg, aluminum alloys, such as AlLi, AlCa, and AlMg, alkali metal alloys and alkaline earth metal alloys.

As shown in FIGS. 3 and 5, the second electrode 140 may include a first layer 140A disposed on the first organic layer 130A, a second layer 140B disposed on the second organic layer 130B and a third layer 140C disposed on the third organic layer 130C. The first layers 140A are formed by vapor deposition using a first mask 50A (described later). The second layers 140B are formed by vapor deposition using a second mask 50B (described later). The third layers 140C are formed by vapor deposition using a third mask 50C (described later).

The first layer 140A may cover the first organic layer 130A. In other words, the size of the first layer 140A in the first direction D1 may be greater than the size of the first organic layer 130A in the first direction D1, and the size of the first layer 140A in the second direction D2 may be greater than the size of the first organic layer 130A in the second direction D2. The second layer 140B may cover the second organic layer 130B. In other words, the size of the second layer 140B in the first direction D1 may be greater than the size of the second organic layer 130B in the first direction D1, and the size of the second layer 140B in the second direction D2 may be greater than the size of the second organic layer 130B in the second direction D2. The third layer 140C may cover the third organic layer 130C. In other words, the size of the third layer 140C in the first direction D1 may be greater than the size of the third organic layer 130C in the first direction D1, and the size of the third layer 140C in the second direction D2 may be greater than the size of the third organic layer 130C in the second direction D2.

The thickness of the first layer 140A, for example, may be greater than or equal to 10 nm, may be greater than or equal to 20 nm, may be greater than or equal to 50 nm, or may be greater than or equal to 100 nm. The thickness of the first layer 140A, for example, may be less than or equal to 200 nm, may be less than or equal to 500 nm, may be less than or equal to 1 µm, or may be less than or equal to 100 µm. The range of the thickness of the first layer 140A may be determined by a first group consisting of 10 nm, 20 nm, 50 nm, and 100 nm and/or a second group consisting of 200 nm, 500 nm, 1 µm, and 100 µm. The range of the thickness of the first layer 140A may be determined by a combination of any one of the values in the first group and any one of the values in the second group. The range of the thickness of the first layer 140A may be determined by a combination of any two of the values in the first group. The range of the thickness of the first layer 140A may be determined by a combination of any two of the values in the second group. For example, the range of the thickness of the first layer 140A may be greater than or equal to 10 nm and less than or equal to 100 µm, may be greater than or equal to 10 nm and less than or equal to 1 µm, may be greater than or equal to 10 nm and less than or equal to 500 nm, may be greater than or equal to 10 nm and less than or equal to 200 nm, may be greater than or equal to 10 nm and less than or equal to 100 nm, may be greater than or equal to 10 nm and less than or equal to 50 nm, may be greater than or equal to 10 nm and less than or equal to 20 nm, may be greater than or equal to 20 nm and less than or equal to 100 µm, may be greater than or equal to 20 nm and less than or equal to 1 µm, may be greater than or equal to 20 nm and less than or equal to 500 nm, may be greater than or equal to 20 nm and less than or equal to 200 nm, may be greater than or equal to 20 nm and less than or equal to 100 nm, may be greater than or equal to 20 nm and less than or equal to 50 nm, may be greater than or equal to 50 nm and less than or equal to 100 µm, may be greater than or equal to 50 nm and less than or equal to 1 µm, may be greater than or equal to 50 nm and less than or equal to 500 nm, may be greater than or equal to 50 nm and less than or equal to 200 nm, may be greater than or equal to 50 nm and less than or equal to 100 nm, may be greater than or equal to 100 nm and less than or equal to 100 µm, may be greater than or equal to 100 nm and less than or equal to 1 µm, may be greater than or equal to 100 nm and less than or equal to 500 nm, may be greater than or equal to 100 nm and less than or equal to 200 nm, may be greater than or equal to 200 nm and less than or equal to 100 µm, may be greater than or equal to 200 nm and less than or equal to 1 µm, may be greater than or equal to 200 nm and less than or equal to 500 nm, may be greater than or equal to 500 nm and less than or equal to 100 µm, may be greater than or equal to 500 nm and less than or equal to 1 µm, or may be greater than or equal to 1 µm and less than or equal to 100 µm.

The thickness of the second layer 140B may be the same as the thickness of the first layer 140A. The thickness of the second layer 140B may be greater or less than the thickness of the first layer 140A. The thickness of the second layer 140B, as in the case of the thickness of the first layer 140A, may be determined by a first group consisting of 10 nm, 20 nm, 50 nm, and 100 nm and/or a second group consisting of 200 nm, 500 nm, 1 µm, and 100 µm.

The thickness of the third layer 140C may be the same as the thickness of each of the first layer 140A and the second layer 140B. The thickness of the third layer 140C may be greater or less than the thickness of each of the first layer 140A and the second layer 140B. The thickness of the third layer 140C, as in the case of the thickness of each of the first layer 140A and the second layer 140B, may be determined by a first group consisting of 10 nm, 20 nm, 50 nm, and 100 nm and/or a second group consisting of 200 nm, 500 nm, 1 µm, and 100 µm.

As shown in FIGS. 3 and 5, two layers of the second electrode 140 may partially overlap each other. An area in which a plurality of layers of the second electrode 140 overlaps in plan view is also referred to as electrode overlap area 145. The electrode overlap area 145 is an area in which the first layer 140A and the second layer 140B overlap, an area in which the first layer 140A and the third layer 140C overlap, or an area in which the second layer 140B and the third layer 140C overlap. When the layers of the second electrode 140 overlap, the layers are able to be electrically connected.

In plan view, the area of the electrode overlap area 145 may be less than the area of the first layer 140A. The ratio of the area of the electrode overlap area 145 to the area of the first layer 140A, for example, may be greater than or equal to 0.02, may be greater than or equal to 0.05, or may be greater than or equal to 0.10. The ratio of the area of the electrode overlap area 145 to the area of the first layer 140A, for example, may be less than or equal to 0.20, may be less than or equal to 0.30, or may be less than or equal to 0.40. The range of the ratio of the area of the electrode overlap area 145 to the area of the first layer 140A may be determined by a first group consisting of 0.02, 0.05, and 0.10 and/or a second group consisting of 0.20, 0.30, and 0.40. The range of the ratio of the area of the electrode overlap area 145 to the area of the first layer 140A may be determined by a combination of any one of the values in the first group and any one of the values in the second group. The range of the ratio of the area of the electrode overlap area 145 to the area of the first layer 140A may be determined by a combination of any two of the values in the first group. The range of the ratio of the area of the electrode overlap area 145 to the area of the first layer 140A may be determined by a combination of any two of the values in the second group. For example, the range of the ratio of the area of the electrode overlap area 145 to the area of the first layer 140A may be greater than or equal to 0.02 and less than or equal to 0.40, may be greater than or equal to 0.02 and less than or equal to 0.30, may be greater than or equal to 0.02 and less than or equal to 0.20, may be greater than or equal to 0.02 and less than or equal to 0.10, may be greater than or equal to 0.02 and less than or equal to 0.05, may be greater than or equal to 0.05 and less than or equal to 0.40, may be greater than or equal to 0.05 and less than or equal to 0.30, may be greater than or equal to 0.05 and less than or equal to 0.20, may be greater than or equal to 0.05 and less than or equal to 0.10, may be greater than or equal to 0.10 and less than or equal to 0.40, may be greater than or equal to 0.10 and less than or equal to 0.30, may be greater than or equal to 0.10 and less than or equal to 0.20, may be greater than or equal to 0.20 and less than or equal to 0.40, may be greater than or equal to 0.20 and less than or equal to 0.30, or may be greater than or equal to 0.30 and less than or equal to 0.40.

In plan view, the area of the electrode overlap area 145 may be less than the area of the second layer 140B. The above-described range of the ratio of the area of the electrode overlap area 145 to the area of the first layer 140A may be adopted as the range of the ratio of the area of the electrode overlap area 145 to the area of the second layer 140B.

In plan view, the area of the electrode overlap area 145 may be less than the area of the third layer 140C. The above-described range of the ratio of the area of the electrode overlap area 145 to the area of the first layer 140A may be adopted as the range of the ratio of the area of the electrode overlap area 145 to the area of the third layer 140C.

Figure 6:
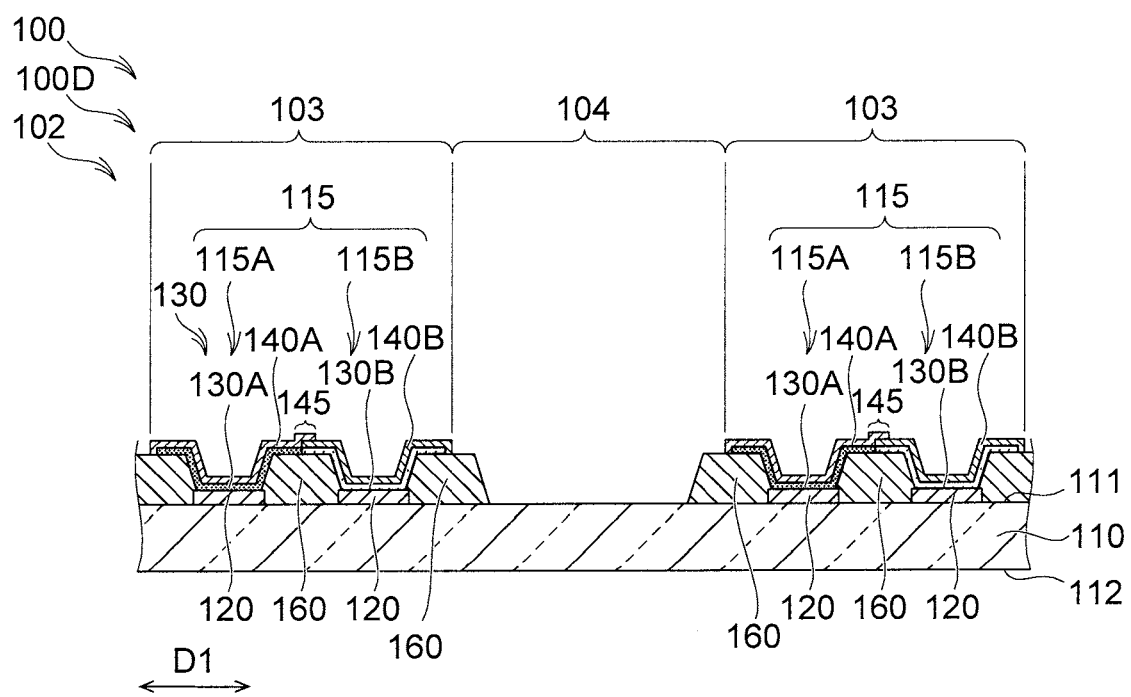
FIG. 6 is a sectional view of the organic device, taken along the line D-D in FIG. 3.

FIG. 6 is a sectional view of the second display area 102 of the organic device 100, taken along the line D-D in FIG. 3.

As shown in FIGS. 3 and 6, the second display area 102 includes an area including the second electrode 140Y and an area not including the second electrode 140Y. The above-described normal areas 103 are defined as areas including the second electrode 140Y. The above-described transmission areas 104 are defined as areas not including the second electrode 140Y.

As shown in FIGS. 3 and 4, each of the normal areas 103 may include areas 103a each including the element 115 and areas 103b each not including the element 115 in plan view. In other words, each of the normal areas 103 may include areas 103a in which the second electrode 140Y and the organic layer 130 overlap and areas 103b in which the second electrode 140Y and the organic layer 130 do not overlap in plan view. Each area 103a includes the second electrode 140Y that overlaps the substrate 110, the first electrode 120 and the organic layer 130 in plan view. Each area 103b includes the second electrode 140Y that overlaps the substrate 110 in plan view. The thus configured areas 103a and areas 103b may be continuously connected from the second connecting portion 105b to the first connecting portion 105a in the second direction D2 to form the above-described second direction part 103L. The above-described connecting portion 105 may be made up of the second electrode 140Y of the area 103b. The normal area 103 does not need to include the area 103b. In other words, all the second electrodes 140Y of the normal area 103 may overlap the organic layers 130 in plan view.

As shown in FIGS. 3 and 6, each of the transmission areas 104 may include an area in which the substrate 110 and the organic layers 130 do not overlap. As shown in FIG. 6, the transmission area 104 does not need to include the first electrode 120, the organic layer 130 or the second electrode 140. As shown in FIG. 6, the transmission area 104 may include part of the insulating layer 160.

As shown in FIG. 4, in each of the normal areas 103, the above-described first element array 115La does not need to include the second element 115B. In other words, the first element array 115La may be made up of the first element 115A and the third element 115C arranged periodically with a pitch EC2 in the second direction D2. In each of the normal areas 103, the above-described second element array 115Lb does not need to include the first element 115A or the third element 115C. In other words, the second element array 115Lb may be made up of the second element 115B arranged periodically with the pitch EC2 in the second direction D2. In each of the normal areas 103, one element 115 may be made up of the first element 115A of the first element array 115La, the third element 115C of the first element array 115La and the second element 115B of the second element array 115Lb.

As shown in FIG. 4, in each of the transmission areas 104, the above-described first element array 115La does not need to include the first element 115A, the second element 115B or the third element 115C. In each of the transmission areas 104, the above-described second element array 115Lb does not need to include the first element 115A, the second element 115B or the third element 115C.

Figure 7:
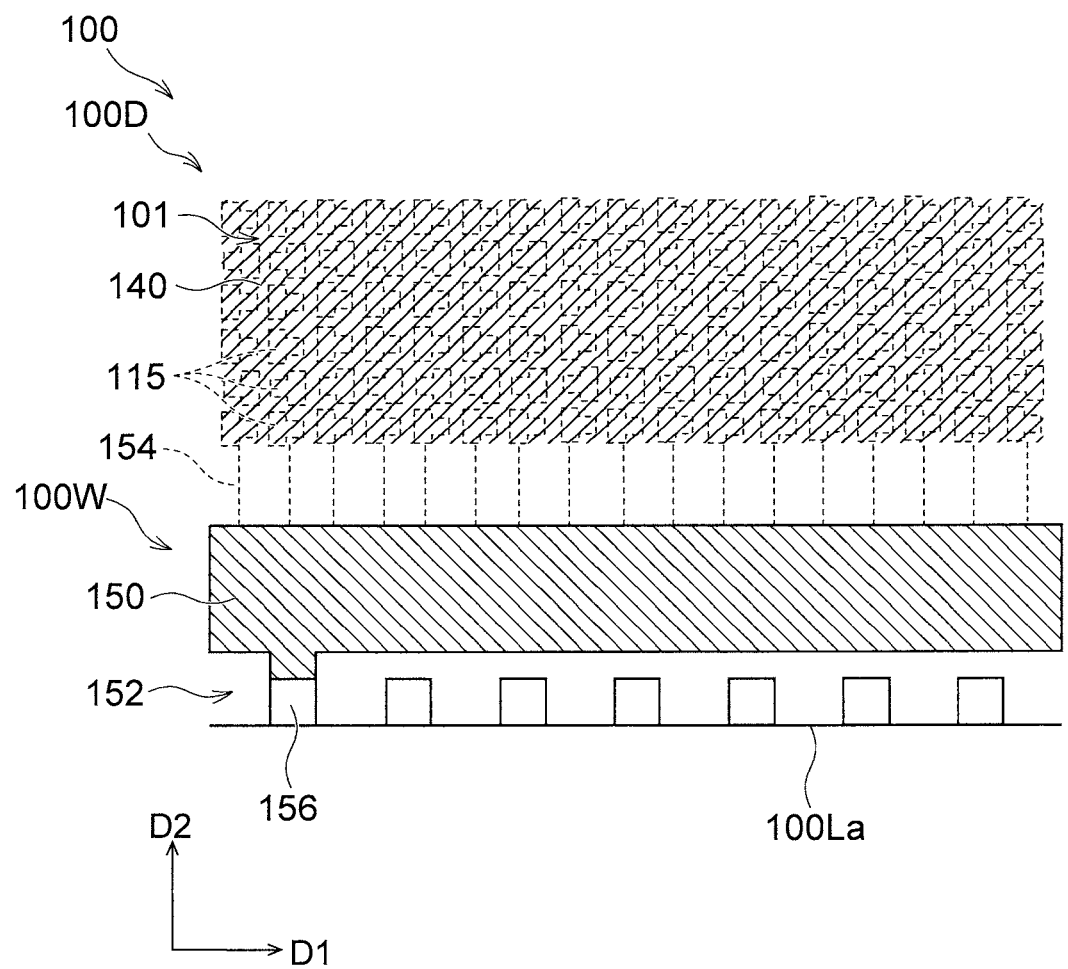
FIG. 7 is an enlarged plan view of the area surrounded by the alternate long and two-short dashed line and indicated by the reference sign A2 in the organic device shown in FIG. 1.

FIG. 7 is an enlarged plan view of the area surrounded by the alternate long and two-short dashed line and indicated by the reference sign A2 in the organic device 100 shown in FIG. 1.

As shown in FIG. 7, the wiring area 100W includes the reference electrode 150 and a terminal 152. The reference electrode 150 may be located on the substrate 110. The reference electrode 150 may be located between the second electrode 140 and the terminal 152 in the second direction D2. As shown in FIG. 7, the reference electrode 150 may be a filled pattern. The reference electrode 150 is electrically connected to the second electrode 140 of each element 115 via a connecting wire 154. The connecting wire 154 may be made up of part of the second electrode 140 or part of the reference electrode 150. The terminal 152 includes a reference terminal 156 connected to an earth or ground. The reference electrode 150 is electrically connected to the reference terminal 156 to define a reference potential. Therefore, when a voltage is applied between the first electrode 120 and the second electrode 140, a current that has flowed from the first electrode 120 to the second electrode 140 through the organic layer 130 is able to flow to the reference electrode 150. The reference potential, for example, may be 0 V, may be a positive value or may be a negative value.

The reference electrode 150 includes a material having electrical conductivity. Examples of the reference electrode 150 may include a metal, a metal oxide having electrical conductivity and other inorganic materials having electrical conductivity. A metal, such as Al, Mo, and Ta, and an inorganic oxide, such as indium tin oxide referred to as ITO, may be used as the material of the reference electrode 150. These conductive materials may be used solely or two or more types of these conductive materials may be used in combination. When two or more types are used, layers respectively made of materials may be laminated. Alternatively, an alloy that includes two or more materials may be used.

The size, gap and the like of each of the components of the organic device 100, such as DD1, DD2, EC1, EC2, ED2, TD1 and TD2, can be measured by observing the image of the cross section of the organic device 100 with a scanning electron microscope.

The thickness of each of the components of the organic device 100, such as the thickness of the substrate 110 and the thickness of the second electrode 140, can be measured by observing the image of the cross section of the organic device 100 with a scanning electron microscope.

Figure 8:
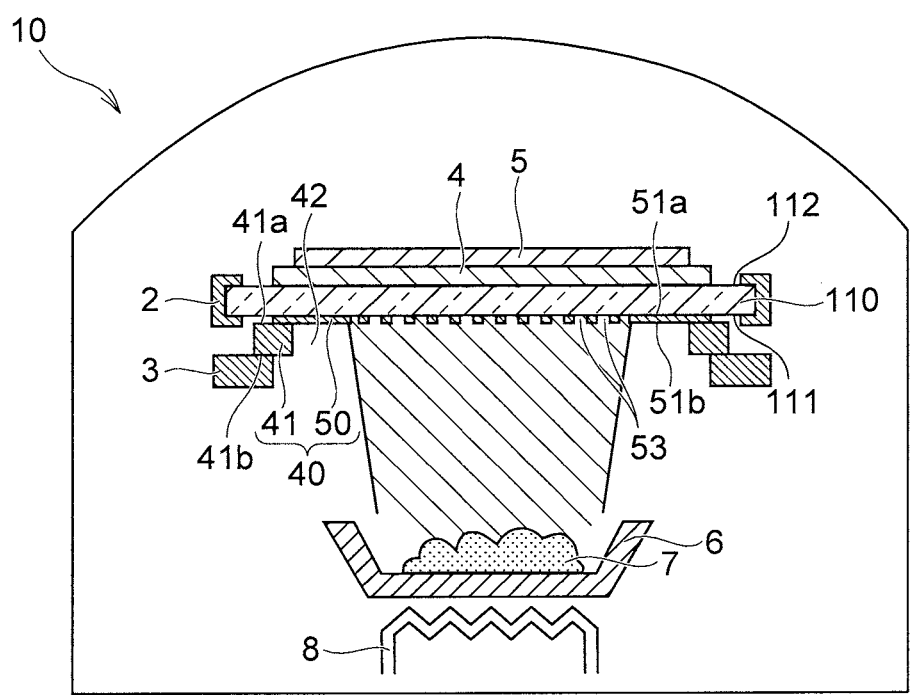
FIG. 8 is a diagram of an example of a vapor deposition apparatus that includes a mask apparatus.

Next, a method of forming the second electrode 140 of the organic device 100 by vapor deposition will be described. FIG. 8 is a diagram of a vapor deposition apparatus 10 that performs a vapor deposition process for depositing a vapor deposition material on an object.

As shown in FIG. 8, the vapor deposition apparatus 10 may include a vapor deposition source 6, a heater 8 and a mask apparatus 40 inside. The vapor deposition apparatus 10 may further include an evacuating means for evacuating the inside of the vapor deposition apparatus 10 into a vacuum atmosphere. The vapor deposition source 6 is, for example, a crucible and contains a vapor deposition material 7, such as an organic luminescent material. The heater 8 vaporizes the vapor deposition material 7 in a vacuum atmosphere by heating the vapor deposition source 6. The mask apparatus 40 is disposed so as to face the crucible 6.

As shown in FIG. 8, the mask apparatus 40 may include at least one mask 50 and a frame 41 supporting the mask 50. The frame 41 may have a first frame face 41a to which the mask 50 is fixed and a second frame face 41b located on the side opposite to the first frame face 41a. The frame 41 may have an opening 42 extending through from the first frame face 41a to the second frame face 41b. The mask 50 may be fixed to the frame 41 so as to cross the opening 42 in plan view. The frame 41 may support the mask 50 in a state where the mask 50 is pulled in a direction along the plane of the mask 50 to suppress deflection of the mask 50.

A first mask 50A, a second mask 50B and a third mask 50C (described later) may be used as the mask 50 of the mask apparatus 40. In the following description, when the configuration of a mask, which is common among the first mask 50A, the second mask 50B and the third mask 50C, is described, the term and the reference sign "mask 50" are used.

As shown in FIG. 8, the mask apparatus 40 is disposed in the vapor deposition apparatus 10 such that the mask 50 faces the substrate 110 that is an object on which the vapor deposition material 7 is deposited. The mask 50 has a plurality of through-holes 53 that pass the vapor deposition material 7 flying from the vapor deposition source 6. In the following description, of the faces of the mask 50, a face located on the side of the substrate 110 is referred to as first face 51a, and a face located on the side opposite to the first face 51a is referred to as second face 51b.

As shown in FIG. 8, the vapor deposition apparatus 10 may include a substrate holder 2 that holds the substrate 110. The substrate holder 2 may be movable in the direction along the thickness of the substrate 110. The substrate holder 2 may be movable in the direction along the plane of the substrate 110. The substrate holder 2 may be configured to control the inclination of the substrate 110. For example, the substrate holder 2 may include a plurality of chucks attached to the outer edge of the substrate 110. Each of the chucks may be independently movable in the direction along the thickness and the plane of the substrate 110.

As shown in FIG. 8, the vapor deposition apparatus 10 may include a mask holder 3 that holds the mask apparatus 40. The mask holder 3 may be movable in the direction along the thickness of the mask 50. The mask holder 3 may be movable in the direction along the plane of the mask 50. For example, the mask holder 3 may include a plurality of chucks attached to the outer edge of the frame 41. Each of the chucks may be independently movable in the direction along the thickness and the plane of the mask 50.

The position of the mask 50 of the mask apparatus 40 with respect to the substrate 110 is able to be adjusted by moving at least any one of the substrate holder 2 and the mask holder 3.

As shown in FIG. 8, the vapor deposition apparatus 10 may include a cooling plate 4 located on the side of the second face 112 that is the face on the side opposite to the first face 111 that is the face on the side of the mask apparatus 40, of the faces of the substrate 110. The cooling plate 4 may have a flow channel for circulating refrigerant inside the cooling plate 4. The cooling plate 4 can suppress an increase in the temperature of the substrate 110 in a vapor deposition process.

As shown in FIG. 8, the vapor deposition apparatus 10 may include a magnet 5 located on the side of the second face 112 that is the face on the side opposite to the mask apparatus 40, of the faces of the substrate 110. As shown in FIG. 8, the magnet 5 may be disposed on the face opposite to the mask apparatus 40, of the faces of the cooling plate 4. The magnet 5 can attract the mask 50 of the mask apparatus 40 toward the substrate 110 by magnetic force. Thus, it is possible to reduce the gap between the mask 50 and the substrate 110 or eliminate the gap. As a result, it is possible to reduce occurrence of a shadow in the vapor deposition process, so it is possible to increase the dimensional accuracy and positional accuracy of the organic layers 130. Here, a shadow means a phenomenon that a vapor deposition material 7 enters the gap between the mask 50 and the substrate 110 and then the thicknesses of the organic layers 130 become uneven. Alternatively, the mask 50 may be attracted toward the substrate 110 with an electrostatic chuck by using an electrostatic force.

When the second electrode 140 is formed by using the above-described vapor deposition apparatus 10, the first layers 140A of the second electrode 140 are formed on the substrate 110 by using the first mask apparatus 40A including the first mask 50A in the vapor deposition apparatus 10. Subsequently, the second layers 140B of the second electrode 140 are formed on the substrate 110 by using the second mask apparatus 40B including the second mask 50B in the vapor deposition apparatus 10. After that, the third layers 140C of the second electrode 140 are formed on the substrate 110 by using the third mask apparatus 40C including the third mask 50C in the vapor deposition apparatus 10. In this way, the plurality of masks 50, that is, the first mask 50A, the second mask 50B, the third mask 50C and the like are used sequentially. A group of the plurality of masks 50 used to form the second electrode 140 of the organic device 100 is also referred to as "mask group".

In vapor deposition using the masks 50, the vapor deposition material 7 having passed through the through-holes 53 from the second face 51b side to the first face 51a side is deposited on the substrate 110, with the result that layers, that is, the first layers 140A, the second layers 140B, the third layers 140C and the like, are formed on the substrate 110. The outline of a layer formed on the substrate 110 in the in-plane direction of the substrate 110 is determined by the outline of the through-hole 53 of the mask 50 in plan view.

Figure 9:
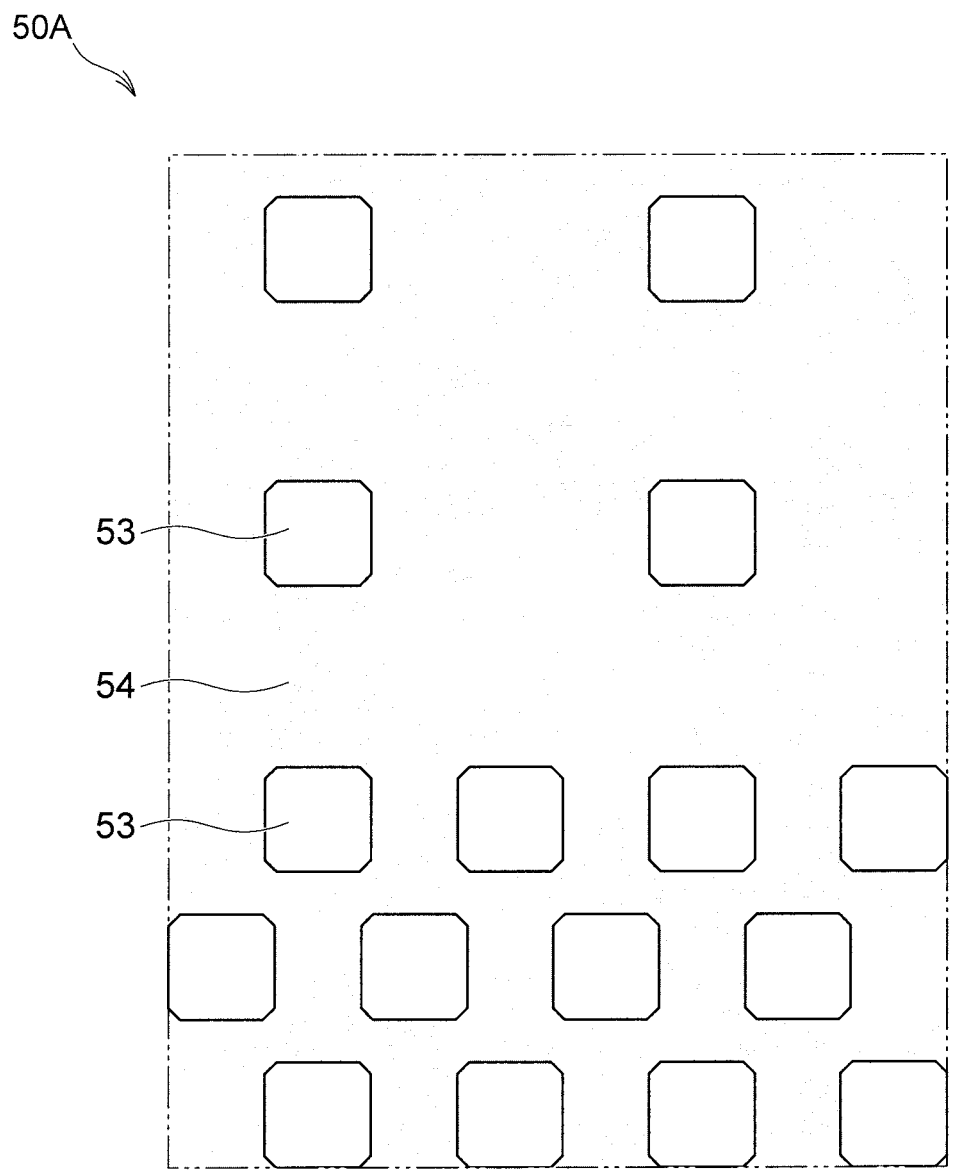
FIG. 9 is an enlarged plan view of a part corresponding to FIG. 3 in a first mask used in the mask apparatus shown in FIG. 8.

FIG. 9 is an enlarged plan view of a part corresponding to FIG. 3 in the first mask 50A used in the mask apparatus shown in FIG. 8. The mask 50 has a first mask direction E1 and a second mask direction E2 orthogonal to the first mask direction E1. The first mask direction E1 may correspond to the first direction D1, and the second mask direction E2 may correspond to the second direction D2.

As shown in FIG. 9, the through-holes 53 of the first mask 50A are provided at locations corresponding to the first layers 140A of the second electrode 140. Although not shown in the drawing, similarly for the second mask 50B as well, the through-holes 53 of the second mask 50B are provided at locations corresponding to the second layers 140B of the second electrode 140. Similarly for the third mask 50C as well, the through-holes 53 of the third mask 50C are provided at locations corresponding to the third layers 140C of the second electrode 140.

The area of the mask 50, other than the through-holes 53, is able to block the vapor deposition material 7 heading toward the substrate 110. The area of the mask 50, other than the through-holes 53, is also referred to as blocking area 54. In the plan view of the first mask 50A of FIG. 9, the blocking area 54 is shaded by hatching.

The thickness T of the mask 50, for example, may be greater than or equal to 5 µm, may be greater than or equal to 10 µm, may be greater than or equal to 15 µm, or may be greater than or equal to 20 µm. The thickness T of the mask 50, for example, may be less than or equal to 25 µm, may be less than or equal to 30 µm, may be less than or equal to 50 µm, or may be less than or equal to 100 µm. The range of the thickness T of the mask 50 may be determined by a first group consisting of 5 µm, 10 µm, 15 and 20 µm and/or a second group consisting of 25 µm, 30 µm, 50 µm, and 100 µm. The range of the thickness T of the mask 50 may be determined by a combination of any one of the values in the first group and any one of the values in the second group. The range of the thickness T of the mask 50 may be determined by a combination of any two of the values in the first group. The range of the thickness T of the mask 50 may be determined by a combination of any two of the values in the second group. For example, the range of the thickness T of the mask 50 may be greater than or equal to 5 µm and less than or equal to 100 µm, may be greater than or equal to 5 µm and less than or equal to 50 µm, may be greater than or equal to 5 µm and less than or equal to 30 µm, may be greater than or equal to 5 µm and less than or equal to 25 µm, may be greater than or equal to 5 µm and less than or equal to 20 µm, may be greater than or equal to 5 µm and less than or equal to 15 µm, may be greater than or equal to 5 µm and less than or equal to 10 µm, may be greater than or equal to 10 µm and less than or equal to 100 µm, may be greater than or equal to 10 µm and less than or equal to 50 µm, may be greater than or equal to 10 µm and less than or equal to 30 µm, may be greater than or equal to 10 µm and less than or equal to 25 µm, may be greater than or equal to 10 µm and less than or equal to 20 µm, may be greater than or equal to 10 µm and less than or equal to 15 µm, may be greater than or equal to 15 µm and less than or equal to 100 µm, may be greater than or equal to 15 µm and less than or equal to 50 µm, may be greater than or equal to 15 µm and less than or equal to 30 µm, may be greater than or equal to 15 µm and less than or equal to 25 µm, may be greater than or equal to 15 µm and less than or equal to 20 µm, may be greater than or equal to 20 µm and less than or equal to 100 µm, may be greater than or equal to 20 µm and less than or equal to 50 µm, may be greater than or equal to 20 µm and less than or equal to 30 µm, may be greater than or equal to 20 µm and less than or equal to 25 µm, may be greater than or equal to 25 µm and less than or equal to 100 µm, may be greater than or equal to 25 µm and less than or equal to 50 µm, may be greater than or equal to 25 µm and less than or equal to 30 µm, may be greater than or equal to 30 µm and less than or equal to 100 µm, may be greater than or equal to 30 µm and less than or equal to 50 µm, or may be greater than or equal to 50 µm and less than or equal to 100 µm.

A contact measurement method may be adopted as a method of measuring the thickness T of the mask 50. The length gauge HEIDENHAIN-METRO MT1271 made by HEIDENHAIN, which includes a ball-bearing guide plunger, may be used as the contact measurement method.

Examples of the material of the mask 50 may include iron alloys that include nickel. The iron alloys may further include cobalt in addition to nickel. Examples of the material of the mask 50 may include iron alloys of which the content of nickel and cobalt in total is higher than or equal to 30 percent by mass and lower than or equal to 54 percent by mass and the content of cobalt is higher than or equal to zero percent by mass and lower than or equal to six percent by mass. Examples of the iron alloys that include nickel or nickel and cobalt may include Invar that includes nickel higher than or equal to 34 percent by mass and lower than or equal to 38 percent by mass, Super-Invar that includes nickel higher than or equal to 30 percent by mass and lower than or equal to 34 percent by mass and further includes cobalt, and low-thermal expansion Fe—Ni plating alloys that include nickel higher than or equal to 38 percent by mass and lower than or equal to 54 percent by mass. When such iron alloys are used, it is possible to reduce the thermal expansion coefficient of the mask 50. When, for example, a glass substrate is used as the substrate 110, the thermal expansion coefficient of the mask 50 is able to be set to a low value equivalent to that of the glass substrate. Thus, in the vapor deposition process, it is possible to suppress a decrease in the dimensional accuracy and positional accuracy of vapor deposition layers formed on the substrate 110 due to a difference in thermal expansion coefficient between the mask 50 and the substrate 110.

Next, a manufacturing method for the above-described organic device 100 will be described. The manufacturing method for the organic device 100 may include a substrate preparation process, an organic layer forming process and a second electrode forming process.

Initially, the substrate preparation process is performed. In the substrate preparation process, the substrate 110 on which the first electrodes 120 and the reference electrode 150 are formed is prepared. The first electrodes 120 and the reference electrode 150 may be formed by, for example, forming a conductive layer on the substrate 110 by sputtering or the like and then patterning the conductive layer by photolithography or the like. The insulating layer 160 located between adjacent two of the first electrodes 120 in plan view may be formed on the substrate 110.

Subsequently, the organic layer forming process is performed. In the organic layer forming process, as shown in FIG. 4, the organic layers 130 that include the first organic layers 130A, the second organic layers 130B and the third organic layers 130C are formed on the first electrodes 120. The first organic layers 130A may be formed by, for example, vapor deposition using a mask having through-holes corresponding to the first organic layers 130A. For example, the first organic layers 130A are able to be formed by depositing an organic material or the like on the first electrodes 120 corresponding to the first organic layers 130A via the mask. The second organic layers 130B may also be formed by, for example, vapor deposition using a mask having through-holes corresponding to the second organic layers 130B. The third organic layers 130C may also be formed by, for example, vapor deposition using a mask having through-holes corresponding to the third organic layers 130C.

Next, the second electrode forming process is performed. In the second electrode forming process, the second electrode 140 is formed on the organic layers 130 by using the above-described mask group. A process of forming the first layers 140A of the second electrode 140 by vapor deposition using the first mask 50A shown in FIG. 9 may be performed. For example, the first layers 140A are able to be formed by depositing a conductive material, such as metal, or the like on the organic layers 130 or the like via the first mask 50A. Subsequently, a process of forming the second layers 140B of the second electrode 140 by vapor deposition using the second mask 50B may be performed. For example, the second layers 140B are able to be formed by depositing a conductive material, such as metal, or the like on the organic layers 130 or the like via the second mask 50B. Subsequently, a process of forming the third layers 140C of the second electrodes 140 by vapor deposition using the third mask 50C may be performed. For example, the third layers 140C are able to be formed by depositing a conductive material, such as metal, or the like on the organic layers 130 or the like via the third mask 50C. In this way, as shown in FIG. 3, the second electrode 140 that includes the first layers 140A, the second layers 140B and the third layers 140C is formed.

The order in which the first layers 140A, the second layers 140B and the third layers 140C are formed is not limited. For example, the first layers 140A may be formed after the second layers 140B are formed, or the first layers 140A and the second layers 140B may be formed after the third layers 140C are formed.

Next, the advantageous effect that is able to be achieved by the above-described organic device 100 will be described.

The second electrode 140Y of each of the normal areas 103 includes the plurality of connecting portions 105 connected to the second electrode 140X of the first display area 101. The plurality of connecting portions 105 includes the first connecting portion 105a located on the side of the first side 100La in the second direction D2. The first connecting portion 105a includes the facing connecting portion 106 located between the transmission areas 104 in the first direction D1. Since the wiring area 100W including the reference electrode 150 expands along the first side 100La, the facing connecting portion 106 faces the reference electrode 150. With this configuration, a route along which a current that has flowed through the second electrode 140Y of each of the normal areas 103 passes through the facing connecting portion 106 and reaches the reference electrode 150 is able to be shortened. Therefore, it is possible to suppress an increase in current resistance against a current that has flowed through the second electrodes 140Y of the normal area 103. More specifically, when a voltage is applied between the first electrode 120 and the second electrode 140, a current flows from the first electrode 120 to the organic layer 130, and the current that has flowed through the organic layer 130 passes through the second electrode 140 and flows to the reference electrode 150. Here, a current that has flowed through the second electrode 140Y of each of the normal areas 103 passes through the connecting portion 105, flows through the second electrode 140X of the first display area 101, and heads toward the reference electrode 150. However, depending on the location of the connecting portion 105, a current from each of the normal areas 103 can bypass to flow into the first display area 101. In this case, the path of current to the reference electrode 150 increases, and a current resistance value can increase. In contrast, since the first connecting portion 105a includes the facing connecting portion 106, a current that has flowed through the second electrode 140Y of each of the normal areas 103 is able to pass through the facing connecting portion 106 facing the reference electrode 150, flow to the second electrode 140X of the first display area 101, and head toward the reference electrode 150. Therefore, it is possible to shorten the path of current to the reference electrode 150, so it is possible to suppress an increase in the resistance value of current. Thus, it is possible to reduce the difference between the amount of current flowing through each of the elements 115 of the first display area 101 and the amount of current flowing through each of the elements 115 of each normal area 103. As a result, it is possible to uniform the amount of current flowing through each of the elements 115 of the organic device 100.

The plurality of connecting portions 105 includes the second connecting portion 105b located on the side of the second side 100Lb in the second direction D2. With this configuration, a current that has flowed through the elements 115 of a part of the first display area 101, located on the side of the second side 100Lb with respect to the second display area 102 is able to flow into the normal area 103 from the second connecting portion 105b, pass through the facing connecting portion 106, and flow into the second electrode 140X of the first display area 101. Therefore, it is possible to shorten the path of current to the reference electrode 150, so it is possible to suppress an increase in the resistance value of current. As a result, it is possible to uniform the amount of current flowing through each of the elements 115 of the organic device 100.

The normal areas 103 includes the second direction part 103L in which the second electrode 140Y extends from the second connecting portion 105b to the first connecting portion 105a in the second direction D2. The facing connecting portion 106 is located at an end of the second direction part 103L, on the side of the first side 100La in the second direction D2. With this configuration, a current that has flowed from the second connecting portion 105b is able to pass through the second direction part 103L in the second direction D2, and flow to the second electrode 140X of the first display area 101 from the facing connecting portion 106. Therefore, it is possible to further shorten the path of current to the reference electrode 150, so it is possible to further suppress an increase in the resistance value of current. As a result, it is possible to further uniform the amount of current flowing through each of the elements 115 of the organic device 100.

Each transmission area 104 extends from an end bordering the first display area 101 on the side of the second side 100Lb in the second direction D2 to an end bordering the first display area 101 on the side of the first side 100La in the second direction D2. In this way, in the second display area 102, each transmission area 104 is able to be disposed over a wide range. With this configuration, it is possible to increase the amount of light that passes through each transmission area 104. Therefore, the amount of light received by the sensor disposed on the back side of the substrate 110 is able to be increased.

Each transmission area 104 includes an area in which the substrate 110 and the organic layers 130 do not overlap in plan view. With this configuration, it is possible to increase the transmittance of each transmission area 104. Therefore, the amount of light received by the sensor disposed on the back side of the substrate 110 is able to be increased.

The second electrode 140Y of each normal area 103 includes the first layer 140A and the second layer 140B that partially overlaps the first layer 140A in plan view. With this configuration, the first layer 140A and the second layer 140B of the second electrode 140Y overlap to form the electrode overlap area 145. The second electrode 140Y has a greater thickness in the electrode overlap area 145 than the other part. Therefore, in the electrode overlap area 145, it is possible to reduce the current resistance value. Thus, it is possible to reduce a difference in the amount of current flowing through each of the elements 115. As a result, it is possible to uniform the amount of current flowing through each of the elements 115 of the organic device 100.

The second electrode 140Y of the normal area 103 includes the third layer 140C that partially overlaps the first layer 140A or the second layer 140B in plan view. With this configuration, the third layer 140C of the second electrode 140Y overlaps the first layer 140A or the second layer 140B of the second electrode 140Y to form the electrode overlap area 145. Therefore, the second electrode 140Y has a further greater thickness in the electrode overlap area 145, so it is possible to further reduce the current resistance value. As a result, it is possible to further uniform the amount of current flowing through each of the elements 115 of the organic device 100.

The occupancy (second occupancy) of the second electrode 140Y in the second display area 102 is higher than or equal to 40% and lower than or equal to 95%. Since the second occupancy is higher than or equal to 40%, it is possible to increase the amount of current flowing through the second electrode 140Y of each normal area 103. Thus, it is possible to suppress the difference between the amount of current flowing through each of the elements 115 of the first display area 101 and the amount of current flowing through each of the elements 115 of each normal area 103. As a result, it is possible to uniform the amount of current flowing through each of the elements 115 of the organic device 100. Since the second occupancy is lower than or equal to 95%, each transmission area 104 is able to be disposed over a wide range in the second display area 102. With this configuration, it is possible to increase the amount of light that passes through each transmission area 104. Therefore, the amount of light received by the sensor disposed on the back side of the substrate 110 is able to be increased.

In the above-described embodiment, the example in which each of the normal areas 103 includes the second direction part 103L in which the second electrode 140Y extends from the second connecting portion 105b to the first connecting portion 105a in the second direction D2 has been described (see FIGS. 2 and 3). However, the configuration is not limited thereto. As long as the first connecting portion 105a includes the facing connecting portion 106, each normal area 103 does not need to include the second direction part 103L. In other words, the second electrode 140Y of each normal area 103 does not need to extend in the second direction D2. For example, the second electrode 140Y of each normal area 103 may extend aslant with respect to the second direction D2 or may extend in a zigzag manner. In this case, each of the transmission areas 104 may also extend aslant with respect to the second direction D2 or may extend in a zigzag manner. In such a case as well, since the first connecting portion 105a includes the facing connecting portion 106, it is possible to shorten the path of current to the reference electrode 150, so it is possible to suppress an increase in the resistance value of current. As a result, it is possible to uniform the amount of current flowing through each of the elements 115 of the organic device 100.

Figure 11:
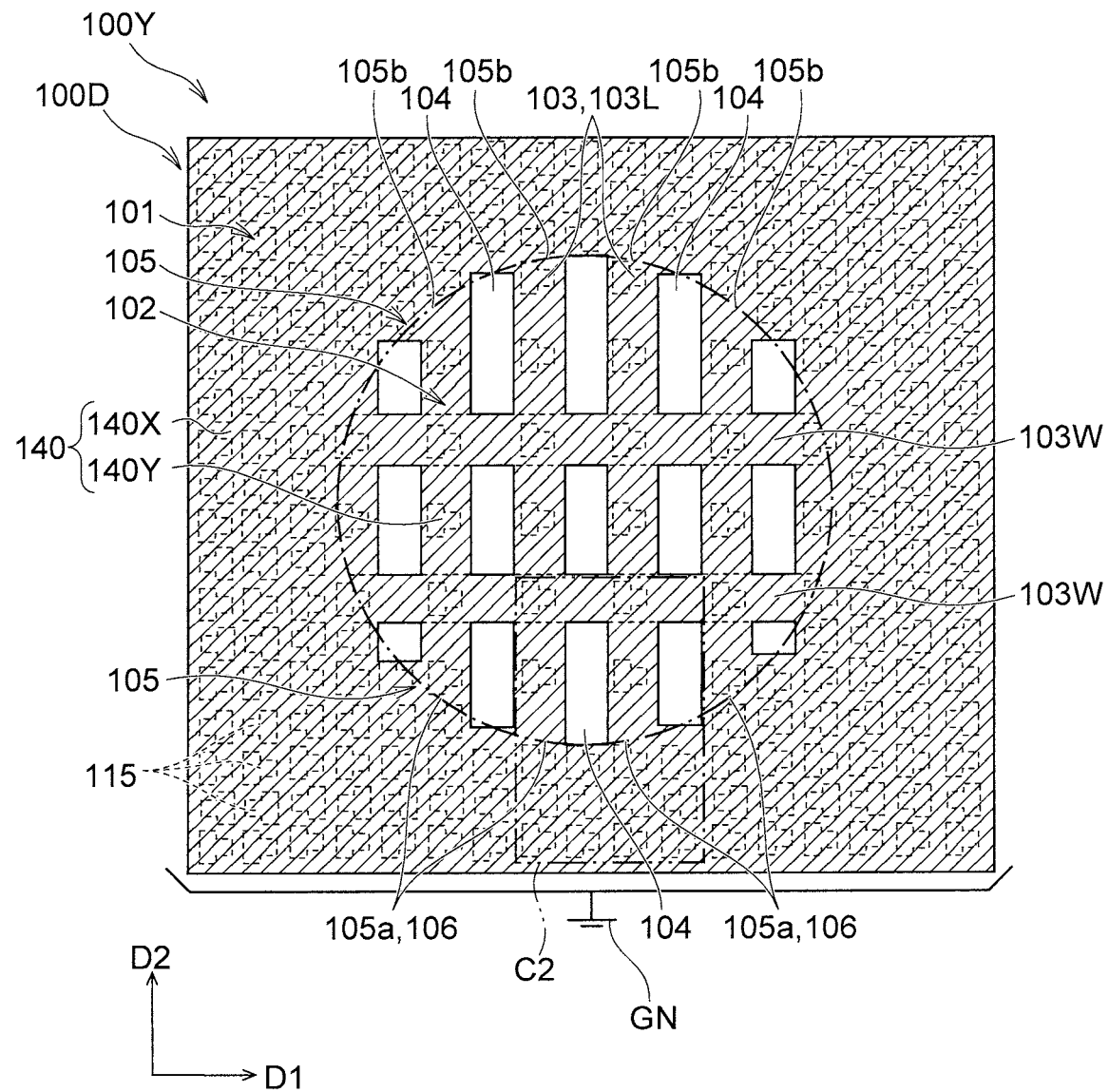
FIG. 11 is a plan view of an organic device according to a second example.
Figure 12:
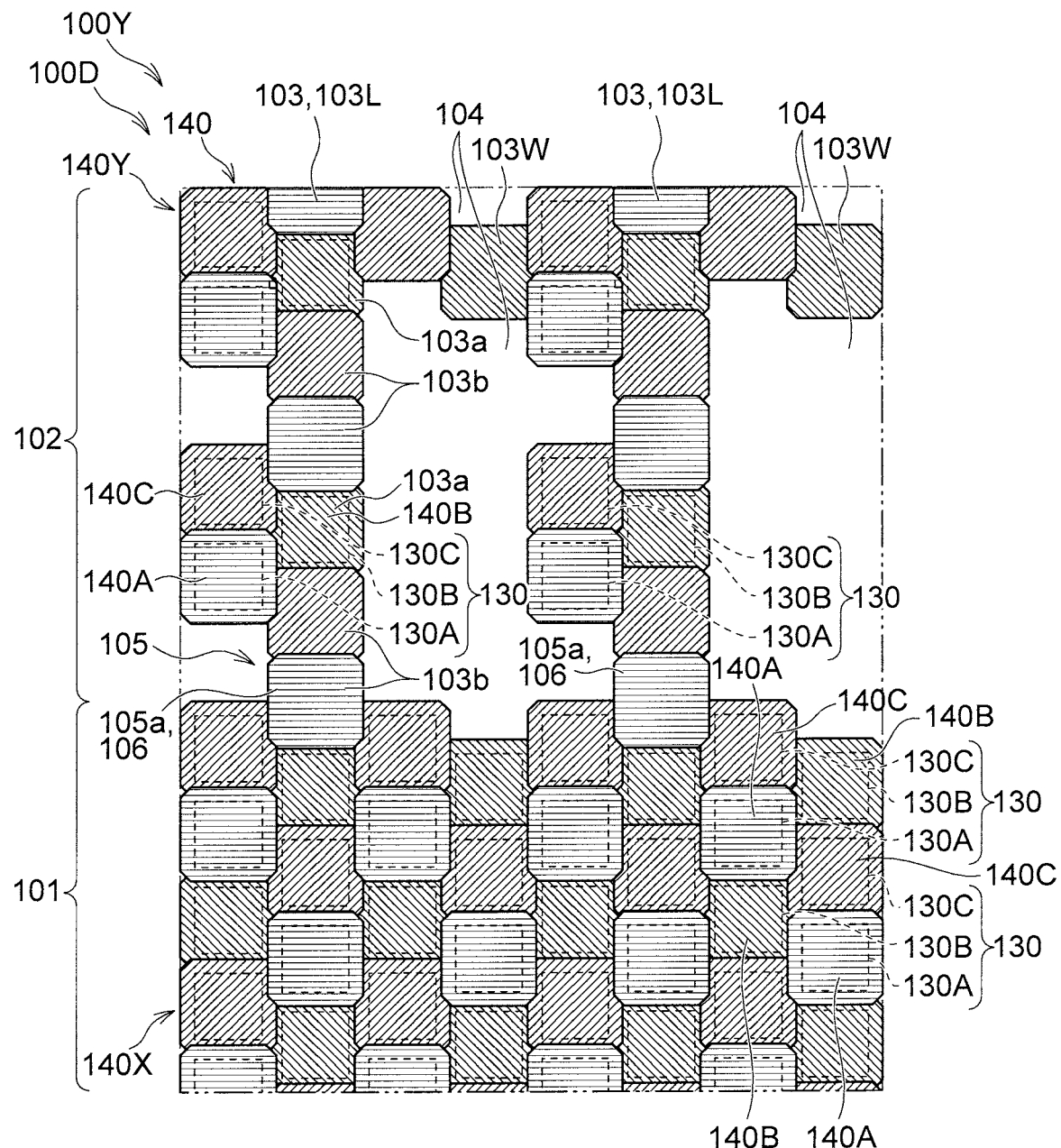
FIG. 12 is an enlarged plan view of the area surrounded by the alternate long and two-short dashed line and indicated by the reference sign C2 in the organic device shown in FIG. 11.

In the above-described embodiment, each normal area 103 may include the first direction part 103W in which the second electrode 140Y extends in the first direction D1 so as to connect the two second direction parts 103L adjacent to each other in the first direction D1 (see FIGS. 11 and 12). The first direction part 103W may extend from an end at one side (left side in FIG. 11) of the second display area 102 in the first direction D1 to an end at the other side (right side in FIG. 11) in the first direction D1. In this case, the transmission areas 104 may be arranged in the first direction D1 and arranged in the second direction D2. In such a case as well, since the first connecting portion 105a includes the facing connecting portion 106, it is possible to shorten the path of current to the reference electrode 150, so it is possible to suppress an increase in the resistance value of current. As a result, it is possible to uniform the amount of current flowing through each of the elements 115 of the organic device 100.

In the above-described embodiment, the example in which each transmission area 104 does not include the first electrode 120, the organic layer 130 or the second electrode 140 has been described. However, the configuration is not limited thereto. Each transmission area 104 may include the first electrode 120 or the organic layer 130. Each transmission area 104 may include the insulating layer 160.

In the above-described embodiment, the example in which the second electrode 140 includes three layers has been described. However, the configuration is not limited thereto. The second electrode 140 may include one layer, two layers, or four or more layers. For example, when the second electrode 140 is made up of one layer, the second electrode 140 may be formed with a filled pattern. The above-described arrangement pattern of the elements 115 is one example. The elements 115 may be arranged with any other arrangement pattern.

According to the above-described embodiment, it is possible to uniform the amount of current flowing through each of the elements of the organic device.

Examples

Next, the embodiment of the present disclosure will be further specifically described by using examples and comparative examples. However, the embodiment of the present disclosure is not limited to those described in the following examples without departing from the scope of the present disclosure.

Figure 10:
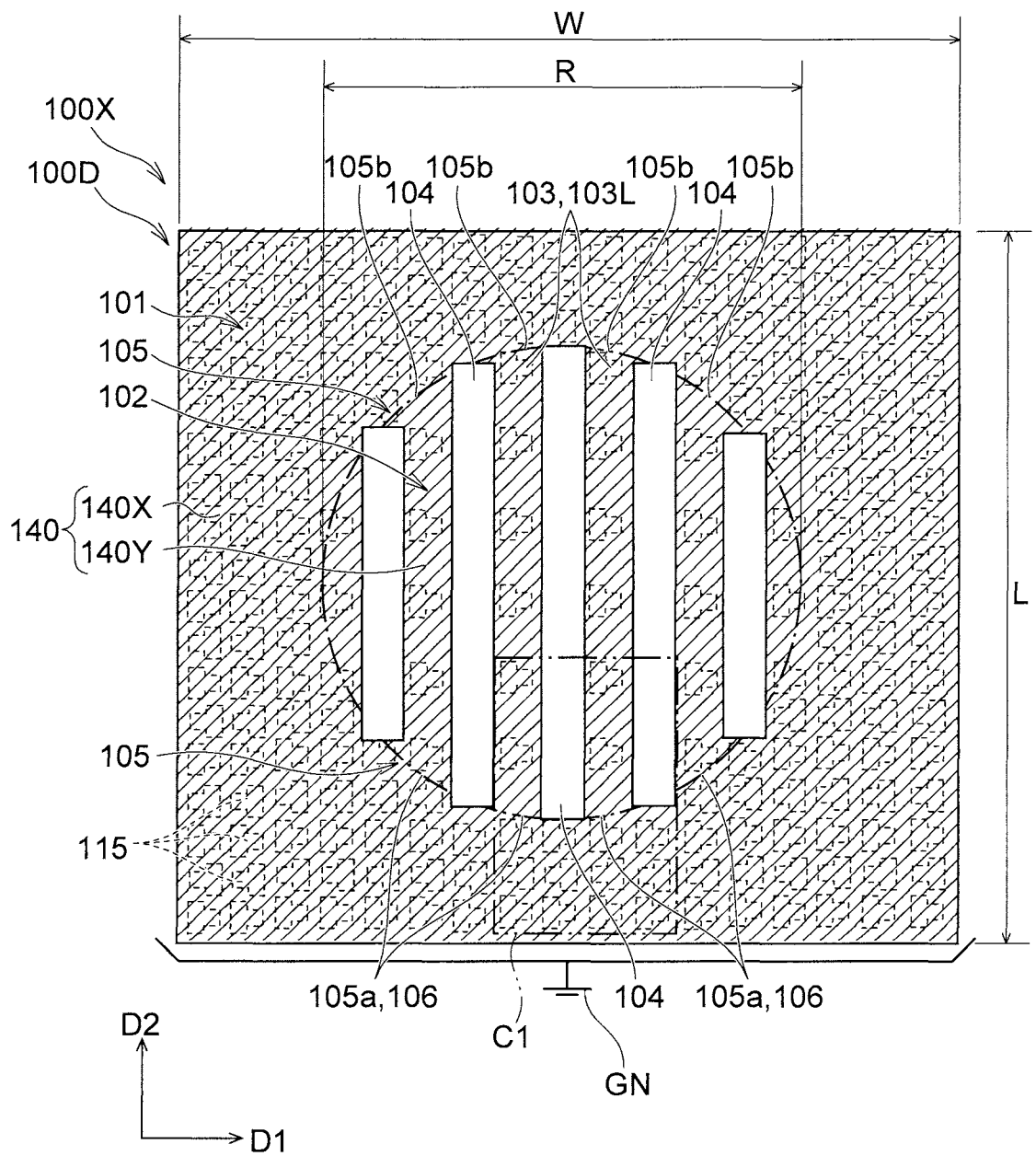
FIG. 10 is a plan view of an organic device according to a first example.

FIG. 10 is a plan view of an organic device 100X according to a first example. In the first example, the value of current flowing through each of the elements 115 of the organic device 100X shown in FIG. 10 was calculated by simulation.

The organic device 100X shown in FIG. 10, as in the case of the organic device 100 shown in FIG. 2, has a display area 100D including a first display area 101 and a second display area 102. The first display area 101 has a square outline, 5 mm on a side. In other words, the size W of the first display area 101 in the first direction D1 is 5 mm and the size L of the first display area 101 in the second direction D2 is also 5 mm. The second display area 102 also has a circular outline. The diameter R of the second display area 102 is 3 mm. The occupancy (second occupancy) of the second electrode 140Y in the second display area 102 is 52%. The side at one side (lower side in FIG. 10) of the first display area 101 in the second direction D2 is connected to a ground GN that defines a reference potential. The reference potential is 0 V. The other configuration of the organic device 100X of FIG. 10 is substantially the same as that of the organic device 100 of FIG. 2. The enlarged view of the area surrounded by the alternate long and two-short dashed line and indicated by the reference sign C1 in the organic device 100X of FIG. 10 is the same as FIG. 3.

FIG. 11 is a plan view of an organic device 100Y according to a second example. FIG. 12 is an enlarged plan view of the area surrounded by the alternate long and two-short dashed line and indicated by the reference sign C2 in the organic device 100Y shown in FIG. 11. In the second example, the value of current flowing through each of the elements 115 of the organic device 100Y shown in FIGS. 11 and 12 is calculated by simulation.

The organic device 100Y shown in FIGS. 11 and 12 has substantially the same configuration as the organic device 100X according to the first example shown in FIG. 10 but differs from the organic device 100X in that each of the normal areas 103 includes the above-described first direction part 103W. The first direction part 103W is a part in which the second electrode 140Y extends in the first direction D1 so as to connect the two second direction parts 103L adjacent to each other in the first direction D1, of the normal areas 103. In the organic device 100Y shown in FIGS. 11 and 12, the first direction part 103W extends from an end at one side (left side in FIG. 11) of the second display area 102 in the first direction D1 to an end at the other side (right side in FIG. 11) in the first direction D1. In other words, the second electrode 140Y included in the first direction part 103W extends from an end at one side in the first direction D1 to an end at the other side in the first direction D1. The occupancy (second occupancy) of the second electrode 140Y in the second display area 102 is 57%.

Figure 13:
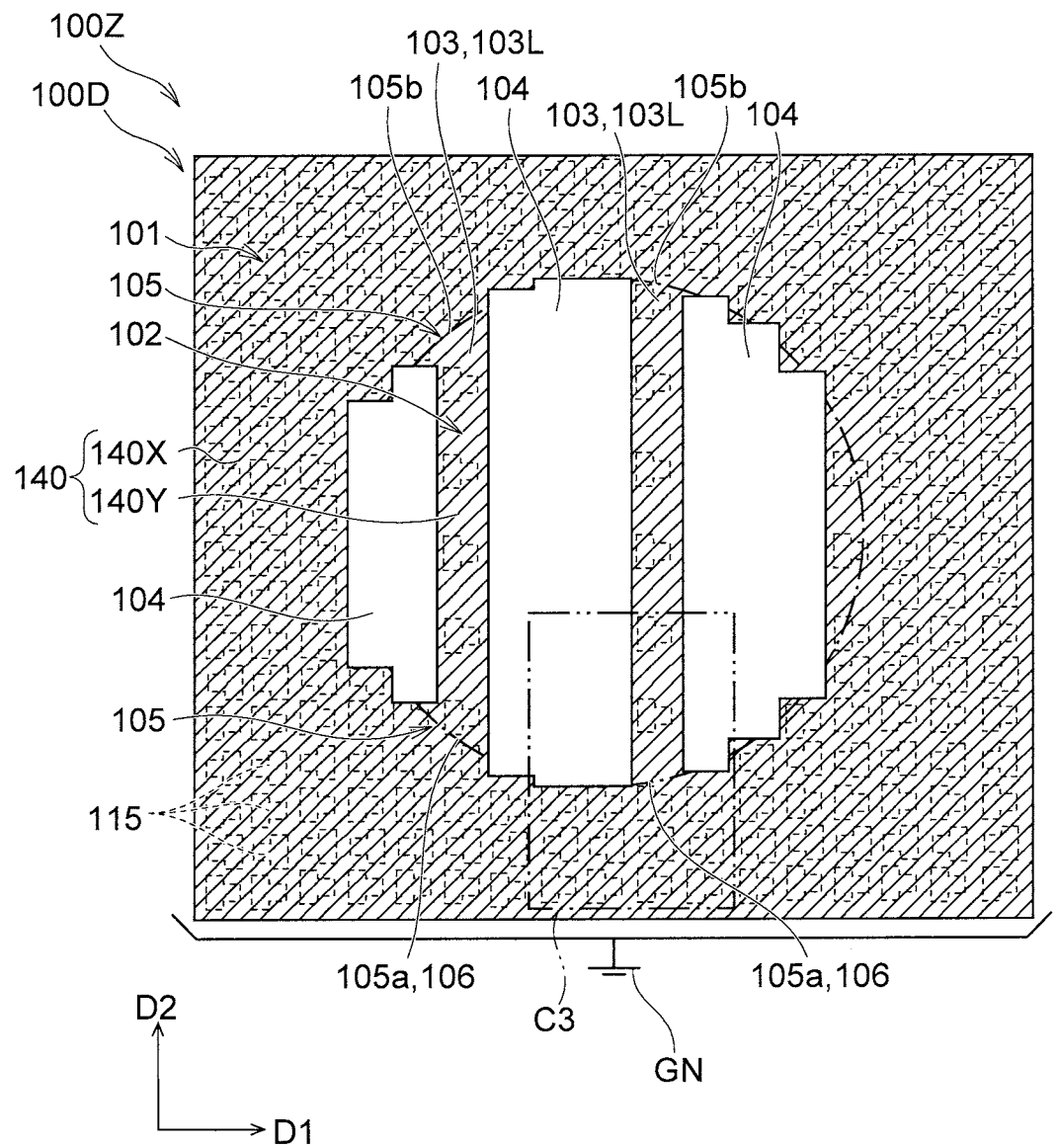
FIG. 13 is a plan view of an organic device according to a third example.
Figure 14:
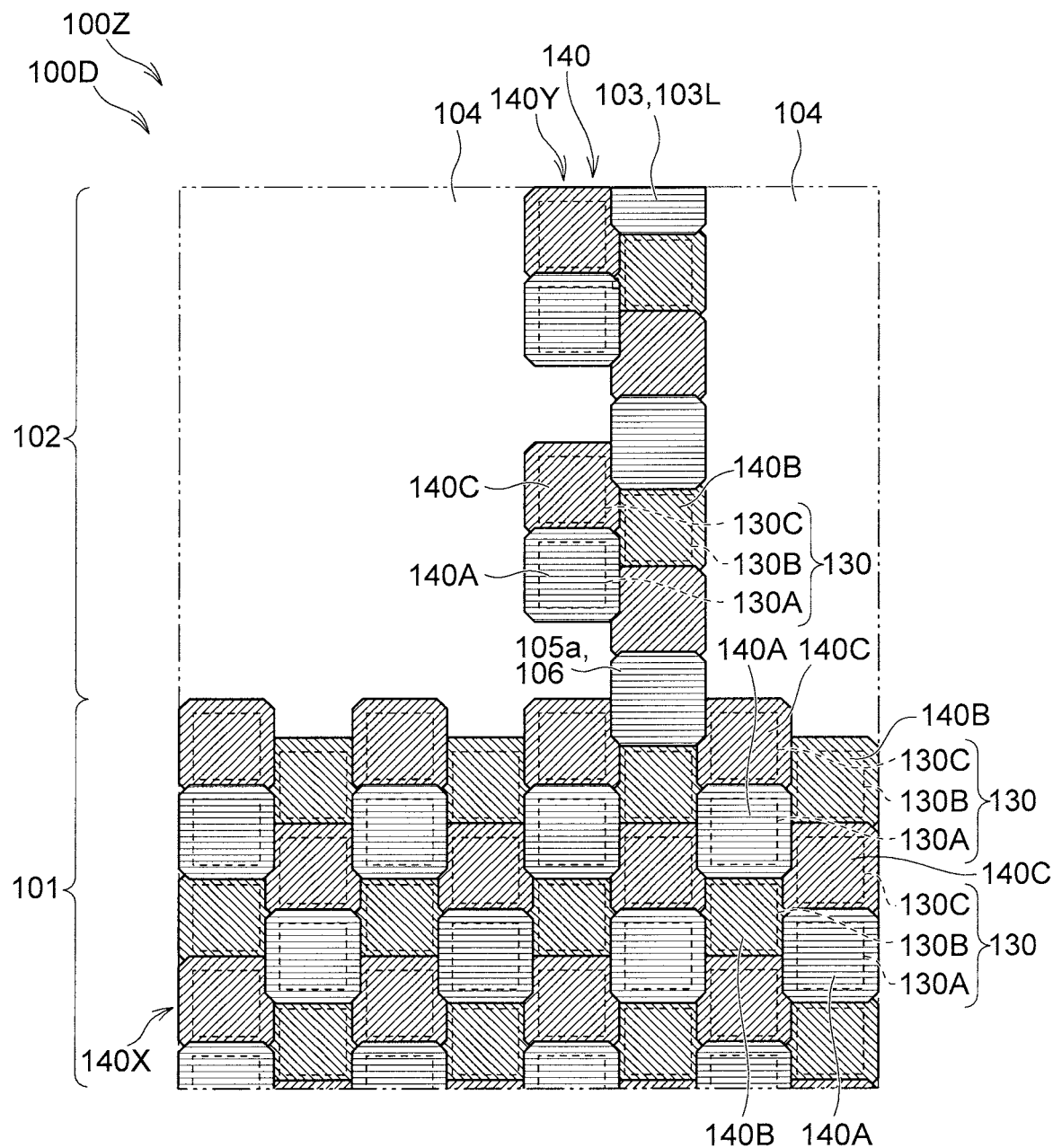
FIG. 14 is an enlarged plan view of the area surrounded by the alternate long and two-short dashed line and indicated by the reference sign C3 in the organic device shown in FIG. 13.

FIG. 13 is a plan view of an organic device 100Z according to a third example. FIG. 14 is an enlarged plan view of the area surrounded by the alternate long and two-short dashed line and indicated by the reference sign C3 in the organic device 100Z shown in FIG. 13. In the third example, the value of current flowing through each of the elements 115 of the organic device 100Z shown in FIGS. 13 and 14 was calculated by simulation.

The organic device 100Z shown in FIGS. 13 and 14 has substantially the same configuration as the organic device 100X according to the first example shown in FIG. 10 but differs from the organic device 100X in that the second occupancy is lower than that in the case of the first example. More specifically, the occupancy (second occupancy) of the second electrode 140Y in the second display area 102 is 26%. In the organic device 1002 shown in FIGS. 13 and 14, the arrangement pitch of the second direction parts 103L in the first direction D1 is twice the case of the first example.

Figure 15:
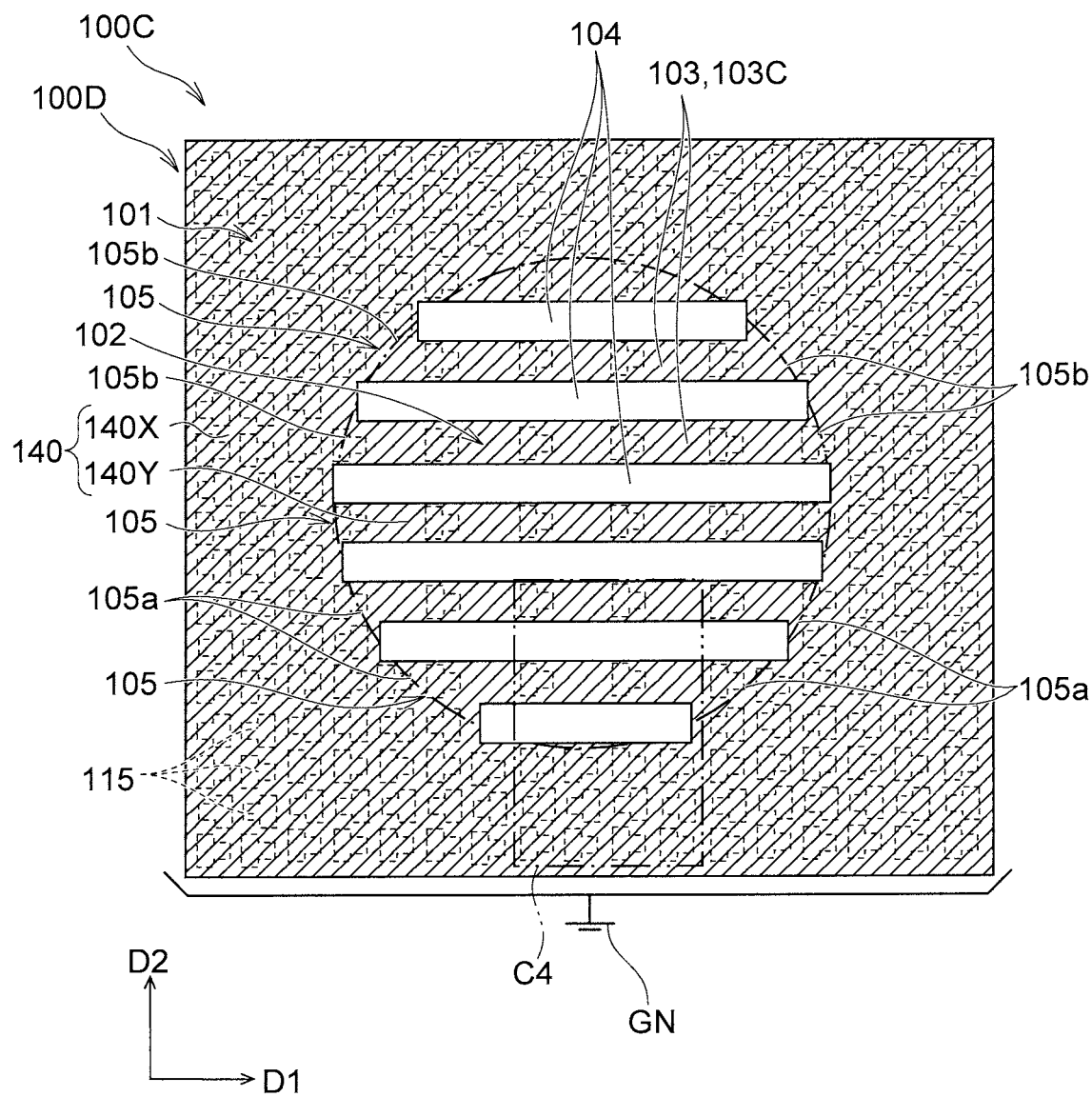
FIG. 15 is a plan view of an organic device according to a comparative example.
Figure 16:
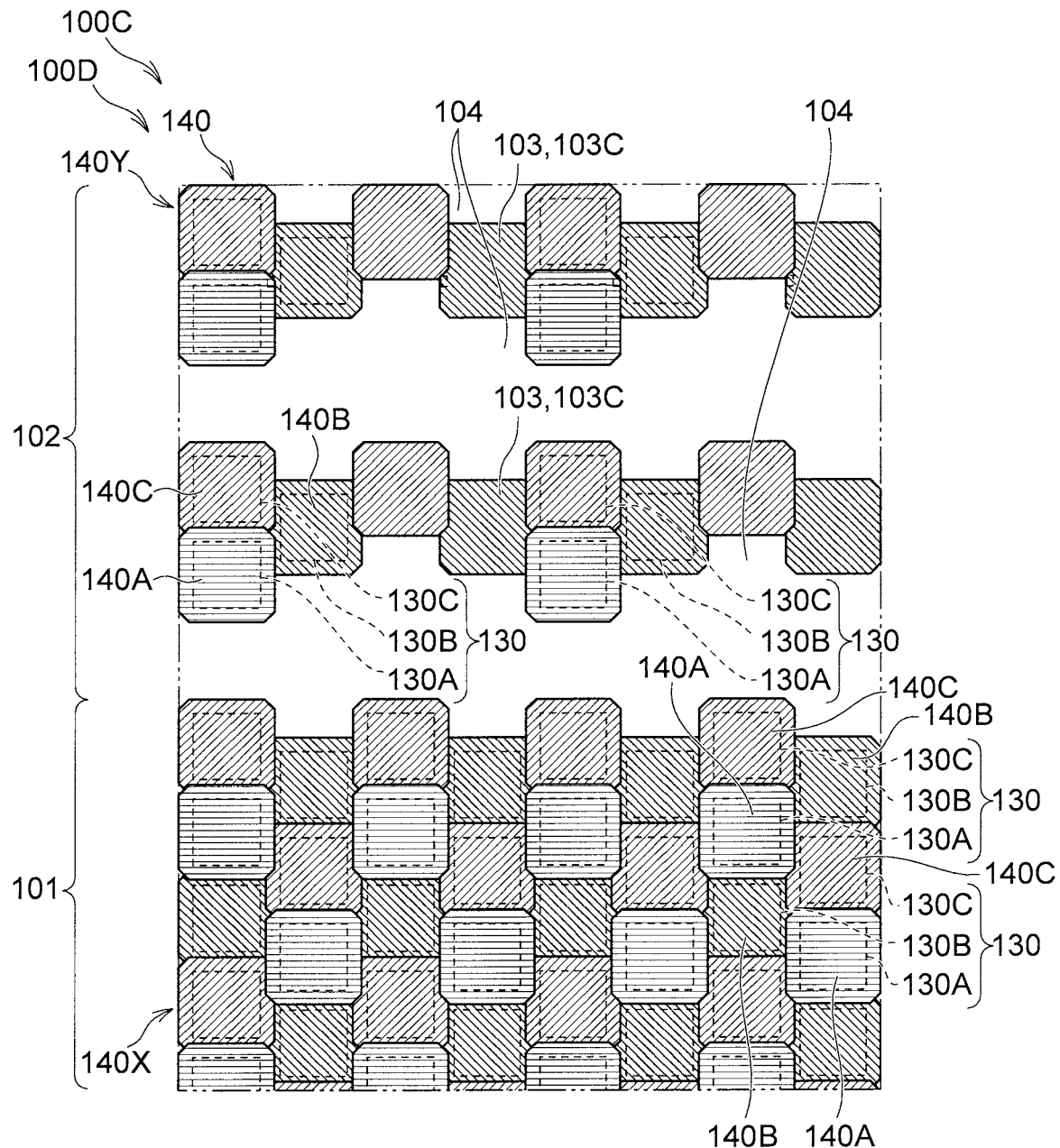
FIG. 16 is an enlarged plan view of the area surrounded by the alternate long and two-short dashed line and indicated by the reference sign C4 in the organic device shown in FIG. 15.

FIG. 15 is a plan view of an organic device 100C according to a comparative example. FIG. 16 is an enlarged plan view of the area surrounded by the alternate long and two-short dashed line and indicated by the reference sign C4 in the organic device 100C shown in FIG. 14. In the comparative example, the value of current flowing through each of the elements 115 of the organic device 100C shown in FIGS. 15 and 16 was calculated by simulation.

The organic device 100C shown in FIGS. 15 and 16 has substantially the same configuration as the organic device 100X according to the first example shown in FIG. 10 but differs from the organic device 100X in that each normal area 103 does not include the above-described second direction part 103L and each normal area 103 includes the first direction part 103C instead. The first direction part 103C is a part that extends from an end at one side (left side in FIG. 15) of the second display area 102 in the first direction D1 to an end at the other side (right side in FIG. 15) in the first direction D1 of each normal area 103. Therefore, in the organic device 100C shown in FIGS. 15 and 16, the first connecting portion 105a does not include the above-described facing connecting portion 106. The occupancy (second occupancy) of the second electrode 140Y in the second display area 102 is 57%.

Figure 17:
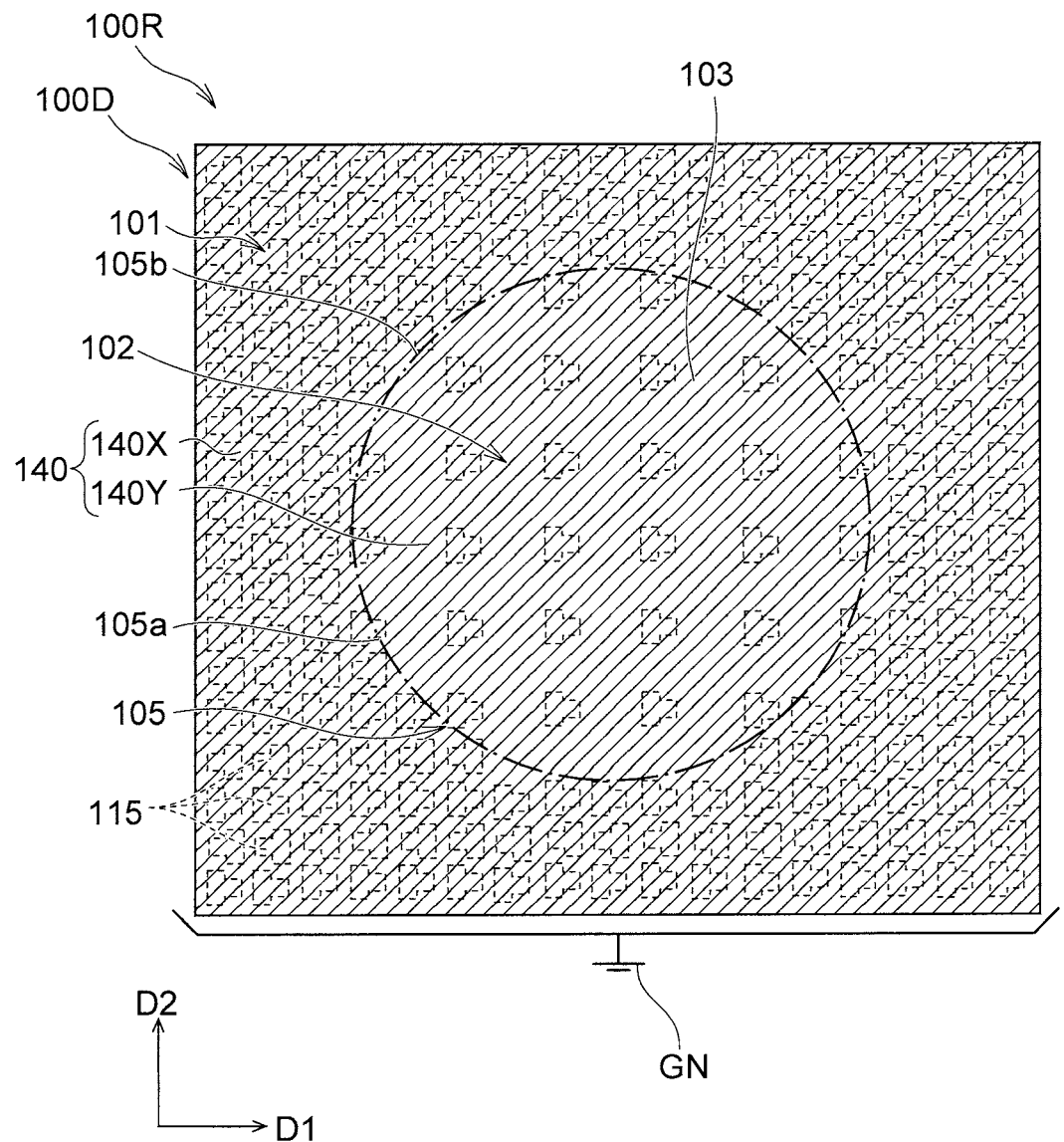
FIG. 17 is a plan view of an organic device according to a reference example.

FIG. 17 is a plan view of an organic device 100R according to a reference example. In the reference example, the value of current flowing through each of the elements 115 of the organic device 100R shown in FIG. 17 was calculated by simulation.

The organic device 100R shown in FIG. 17 has substantially the same configuration as the organic device 100X according to the first example shown in FIG. 10 but differs from the organic device 100X in that the second display area 102 does not include the transmission area 104. In other words, the second display area 102 is made up of the normal area 103. In this case, the occupancy (second occupancy) of the second electrode 140Y in the second display area 102 is 100%. In the organic device 100R shown in FIG. 17, for the sake of convenience, an area at the same location as the second display area 102 of the first example is referred to as second display area 102. In the organic device 100R shown in FIG. 17, the second electrode 140 is made up of one layer, and the second electrode 140 is formed with a filled pattern. In other words, the second electrode 140 is made up of the first layers 140A and does not include the second layers 140B or the third layers 140C that overlap the first layers 140A in plan view. Therefore, no electrode overlap area 145 is formed.

In simulation, the current value of current flowing through each element 115 at the time when a predetermined voltage is applied to the element 115 was calculated. Of the current values, the maximum current value was recorded as maximum current value $I_{max}$, the minimum current value was recorded as minimum current value $I_{min}$, and the difference was recorded as current difference value $I_{diff}$. The simulation results of the examples, comparative example and reference example are shown in FIG. 18. In FIG. 18, a numeric value in parentheses in the field of current difference value $I_{diff}$ indicates the percentage of the current difference value $I_{diff}$ to the maximum current value $I_{max}$.

As is apparent from FIG. 18, it was confirmed that the current difference values $I_{diff}$ in the first example, the second example and the third example were less than the current difference value $I_{diff}$ in the comparative example. In this way, it was confirmed that, when the first connecting portion 105a included the facing connecting portion 106, the amount of current flowing through each element 115 was able to be uniformed.

Most of all, it was confirmed that the current difference values $I_{diff}$ in the first example and the second example were less than the current difference value $I_{diff}$ in the reference example. In other words, it was confirmed that, although the first example and the second example included the transmission areas 104, the current difference values $I_{diff}$ were less than that of the reference example not including the transmission areas 104. This is presumably because, in the first example and the second example, the electrode overlap area 145 is formed, the thickness of the second electrode 140Y is increased at the electrode overlap area 145, and the current resistance value is reduced. In this way, it was confirmed that, when the first connecting portion 105a included the facing connecting portion 106 and the second electrode 140 included the plurality of layers 140A, 140B, 140C, the amount of current flowing through each element 115 was able to be further uniformed.

In addition, it was confirmed that the current difference values $I_{diff}$ in the first example and the second example were less than the current difference value $I_{diff}$ in the third example. This is presumably because, in the first example and the second example, the second occupancy is higher than that of the third example and the amount of current flowing through the second electrode 140Y of each normal area 103 is increased. It was found that, when the threshold for the current difference value $I_{diff}$ was set to 0.26 nA, the current difference value $I_{diff}$ was less than or equal to the threshold when the second occupancy was higher than or equal to 40%. In this way, it was confirmed that, when the first connecting portion 105a included the facing connecting portion 106 and the second occupancy was higher than or equal to 40%, the amount of current flowing through each element 115 was able to be further uniformed.

The invention claimed is:

1. An organic device comprising:
   an outer edge including a first side and a second side extending in a first direction and facing in a second direction orthogonal to the first direction and a third side and a fourth side extending in a direction from the first side toward the second side;
   a wiring area expanding along the first side; and
   a display area bordering the wiring area, wherein
   the display area includes a first electrode, an organic layer disposed on the first electrode and a second electrode disposed on the organic layer,
   the wiring area includes a reference electrode electrically connected to the second electrode and defining a reference potential,
   the display area includes a first display area and a second display area bordering the first display area,
   the second display area includes a normal area including the second electrode and transmission areas not including the second electrode and arranged in the first direction,
   the second electrode of the normal area includes a plurality of connecting portions connected to the second electrode of the first display area,
   the plurality of connecting portions includes a first connecting portion located on the side of the first side in the second direction, and
   the first connecting portion includes a facing connecting portion located between the transmission areas in the first direction.

2. The organic device according to claim 1, wherein the plurality of connecting portions includes a second connecting portion located on the side of the second side in the second direction.

3. The organic device according to claim 2, wherein
   the normal area includes a second direction part in which the second electrode extends from the second connecting portion to the first connecting portion in the second direction, and
   the facing connecting portion is located at an end of the second direction part on the side of the first side in the second direction.

4. The organic device according to claim 3, wherein the transmission area extends from an end bordering the first display area on the side of the second side in the second direction to an end bordering the first display area on the side of the first side in the second direction.

5. The organic device according to claim 3, wherein the normal area includes a first direction part in which the second electrode extends in the first direction so as to connect the two second direction parts adjacent to each other in the first direction.

6. The organic device according to claim 1, wherein the normal area includes an area in which the second electrode and the organic layer do not overlap in plan view.

7. The organic device according to claim 1, wherein the transmission area includes an area in which a substrate of the organic device and the organic layer do not overlap in plan view.

8. The organic device according to claim 1, wherein the first connecting portion includes the two or more facing connecting portions.

9. The organic device according to claim 1, wherein the size of the first connecting portion in the first direction is greater than or equal to 5 µm and less than or equal to 500 µm.

10. The organic device according to claim 1, wherein the first connecting portions are arranged in the first direction with a gap greater than or equal to 10 µm and less than or equal to 550 µm.

11. The organic device according to claim 1, wherein the second electrode of the normal area includes a first layer and a second layer that partially overlaps the first layer in plan view.

12. The organic device according to claim 11, wherein the second electrode of the normal area includes a third layer that partially overlaps the first layer or the second layer in plan view.

13. The organic device according to claim 1, wherein the occupancy of the second electrode in the second display area is higher than or equal to 40% and lower than or equal to 95%.

14. The organic device according to claim 1, wherein
the first electrode contains a metal oxide, and
the second electrode contains a metal.

15. A manufacturing method for the organic device according to claim 1, the manufacturing method comprising:
a second electrode forming step of forming the second electrode on the organic layer provided on the first electrode, wherein
the second electrode includes a first layer and a second layer that partially overlaps the first layer in plan view, and
the second electrode forming step includes
a step of forming the first layer by vapor deposition using a first mask, and
a step of forming the second layer by vapor deposition using a second mask.

16. The manufacturing method for the organic device according to claim 15, wherein
the second electrode includes a third layer that partially overlaps the first layer or the second layer in plan view, and
the second electrode forming step includes a step of forming the third layer by vapor deposition using a third mask.

* * * * *